(12) United States Patent
Hoshino

(10) Patent No.: US 8,638,546 B2
(45) Date of Patent: Jan. 28, 2014

(54) ELECTRONIC APPARATUS

(75) Inventor: Hironari Hoshino, Tokyo (JP)

(73) Assignee: Sony Corporation, Tokyo (JP)

(*) Notice: Subject to any disclaimer, the term of this patent is extended or adjusted under 35 U.S.C. 154(b) by 266 days.

(21) Appl. No.: 13/190,851

(22) Filed: Jul. 26, 2011

(65) Prior Publication Data

US 2012/0057280 A1 Mar. 8, 2012

(30) Foreign Application Priority Data

Sep. 6, 2010 (JP) ................................ 2010-199346

(51) Int. Cl.
*H05K 7/00* (2006.01)
(52) U.S. Cl.
USPC ................................................. 361/679.01
(58) Field of Classification Search
CPC ......................................................... H05K 7/00
USPC ................................................... 361/679.01
See application file for complete search history.

(56) References Cited

U.S. PATENT DOCUMENTS

| 7,512,426 B2 * | 3/2009 | Maatta et al. ............. 455/575.1 |
| 8,353,082 B2 * | 1/2013 | Naukkarinen .................. 16/354 |
| 2011/0063809 A1 | 3/2011 | Hoshino |

FOREIGN PATENT DOCUMENTS

| JP | 2008025827 A * | 2/2008 |
| JP | 2008-75747 | 4/2008 |

OTHER PUBLICATIONS

JP 2008025827 Abstract, Nakada, Kazuhiko, Parallel Biaxial Hinge Module, Feb. 7, 2008.*

* cited by examiner

*Primary Examiner* — Timothy Thompson
*Assistant Examiner* — Charles Pizzuto
(74) *Attorney, Agent, or Firm* — Sony Corporation

(57) ABSTRACT

An electronic apparatus includes: a first casing; a second casing; a hinge section which includes a first turning shaft provided at one end portion of the first casing and a second turning shaft provided at one end portion of the second casing and connects the first and second casings so as to be able to be opened or closed in a range from a folded state to a back-to-back state through the first and second turning shafts; a display section provided on one face of the second casing; and a displacement section which displaces the display section to the other end side of the second casing in the folded state and the back-to-back state of the first and second casings and displaces the display section to one end side of the second casing in a spread state of the first and second casings.

11 Claims, 29 Drawing Sheets

ELECTRONIC APPARATUS

BACKGROUND

The present disclosure relates to an electronic apparatus and is suitably applied to, for example, a folding-type electronic apparatus formed by connecting a first casing and a second casing so as to be able to be opened and closed.

In a folding-type electronic apparatus in the related art, a first member provided with operation keys and a second member provided with a display are connected to each other through a hinge device. A first turning shaft section and a second turning shaft section are provided in parallel with each other in the hinge device, the first member is pivotally mounted on the first turning shaft section so as to be able to turn, and also the second member is pivotally mounted on the second turning shaft section so as to be able to turn.

Further, in the hinge device, a first turning section and a second turning section which turn relative to each other are respectively provided at the first turning shaft section and the second turning shaft section. Further, in the hinge device, the first turning section and the second turning section are connected to each other by an interlocking link.

Accordingly, in the hinge device, turning of the first turning section is transmitted to the second turning section by the interlocking link, whereby the first turning section and the second turning section are turned in conjunction with each other. In this way, the electronic apparatus is made such that the first member and the second member can turn through 360 degrees relative to each other through the hinge device (refer to Japanese Unexamined Patent Application Publication 2008-75747 (Pages 8 to 10 and FIGS. 7 to 13), for example).

SUMMARY

In the folding-type electronic apparatus having such a configuration, if the first member and the second member are opened and, for example, the operation key is then operated, a variety of processes are executed in accordance with the operation, whereby information indicating the execution status of the process is displayed on the display.

Accordingly, in the folding-type electronic apparatus, in a case where the first member and the second member are opened and the operation key is then operated, the execution status of a process according to the operation is appropriately ascertained through the display.

Incidentally, in general, in the folding-type electronic apparatus, when the first member and the second member are opened and the operation key is then operated, the closer the operation key and the display are, the smaller the amount of eye movement between the operation key and the display becomes, so that eyestrain is reduced, whereby usability can be improved.

However, in the folding-type electronic apparatus in the related art, since the hinge device is interposed between the first member and the second member, the operation key and the display are correspondingly far away from each other. For this reason, in the folding-type electronic apparatus, it may not be said that it is possible to make the amount of eye movement between the operation key and the display small in order to reduce eyestrain when the first member and the second member are opened and the operation key is then operated, and there is a problem in that it is difficult to improve usability.

It is desirable to propose an electronic apparatus in which usability can be improved.

According to an embodiment of the present disclosure, there is provided an electronic apparatus in which a first casing and a second casing are connected to each other by a hinge section which includes a first turning shaft provided at a first casing one end portion of the first casing and a second turning shaft provided at a second casing one end portion of the second casing, so as to be able to be opened and closed in a range from a folded state to a back-to-back state through the first turning shaft and the second turning shaft, and by a displacement section, a display section provided on a second casing one face of the second casing is displaced to a second casing other end side in the folded state and the back-to-back state of the first casing and the second casing and displaced to a second casing one end side in a spread state of the first casing and the second casing.

Therefore, according to the embodiment of the present disclosure, in a case where a display surface or operation keys in a first casing one face and a display surface in the second casing one face is visually observed in the spread state of the first casing and the second casing, the amount of eye movement between the display surface or the operation keys in the first casing one face and the display surface in the second casing one face is reduced, so that eyestrain can be reduced.

According to the embodiment of the present disclosure, in the electronic apparatus, by a configuration made such that the first casing and the second casing are connected to each other by the hinge section which includes the first turning shaft provided at the first casing one end portion of the first casing and the second turning shaft provided at the second casing one end portion of the second casing, so as to be able to be opened and closed in a range from the folded state to the back-to-back state through the first turning shaft and the second turning shaft, and such that by the displacement section, the display section provided on the second casing one face of the second casing is displaced to the second casing other end side in the folded state and the back-to-back state of the first casing and the second casing and displaced to the second casing one end side in the spread state of the first casing and the second casing, in a case where the display surface or the operation keys in the first casing one face and the display surface in the second casing one face is visually observed in the spread state of the first casing and the second casing, the amount of eye movement between the display surface or the operation keys in the first casing one face and the display surface in the second casing one face is reduced, so that eyestrain can be reduced, whereby it is possible to realize an electronic apparatus in which usability can be improved.

DETAILED DESCRIPTION OF EMBODIMENTS

Hereinafter, the best mode (hereinafter this is also referred to as an embodiment) for carrying out the present disclosure will be described using the drawings. In addition, a description will be made in the following order.

1. Embodiment
2. Modified Examples

1. Embodiment

1-1. Appearance Configuration of Folding-type Electronic Apparatus

Figure 1:
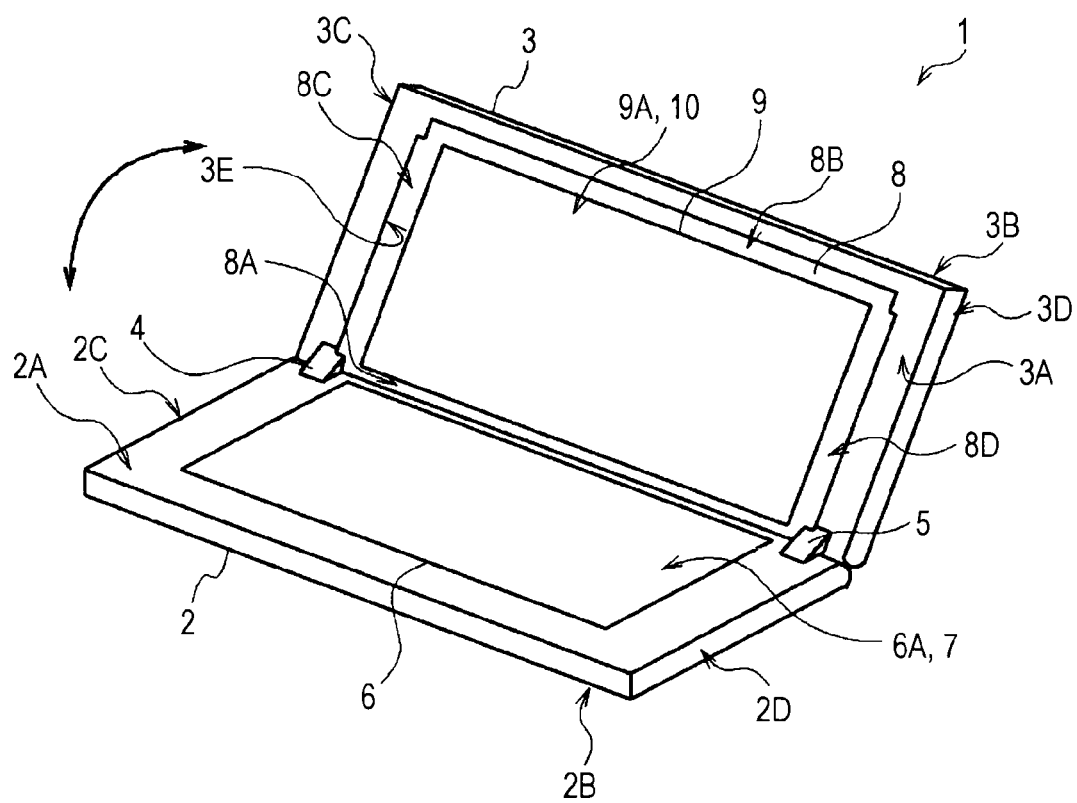
FIG. 1 is a diagrammatic perspective view illustrating one embodiment of the appearance configuration of a folding-type electronic apparatus according to the present disclosure.

In FIG. 1, reference numeral 1 generally denotes a folding-type electronic apparatus according to the present disclosure. In such an electronic apparatus 1, one end portion of a first casing 2 of an approximately flat rectangular shape and one end portion of a second casing 3 of an approximately flat rectangular shape are connected to each other through first and second hinge sections 4 and 5 each having a two-shaft configuration.

Accordingly, the electronic apparatus 1 is formed such that the first casing 2 and the second casing 3 can be opened or closed in a range of 0 degrees to 360 degrees from a folded state where each of one faces 2A and 3A are matched to each other to a back-to-back state where each of other faces 2B and 3B are matched to each other.

Incidentally, in the following explanation, one end of the first casing 2 is also referred to as a first casing one end and the other end on the opposite side to the first casing one end in the first casing 2 is also referred to as a first casing other end.

Further, in the following explanation, a direction from the first casing one end toward the first casing other end in the first casing 2 and a direction from the first casing other end toward the first casing one end, which is opposite to the above direction, are also collectively referred to as a first casing depth direction.

Further, in the following explanation, one face 2A of the first casing 2 is also referred to as a first casing one face 2A and the other face 2B of the first casing 2 is also referred to as a first casing other face 2B.

Further, in the following explanation, a direction from the first casing one face 2A toward the first casing other face 2B in the first casing 2 and a direction from the first casing other face 2B toward the first casing one face 2A, which is opposite to the above direction, are also collectively referred to as a first casing thickness direction.

Further, in the following explanation, a side face 2C on one side of the first casing 2 is also referred to as a first casing left side face 2C and a side face 2D on the other side of the first casing 2 is also referred to as a first casing right side face 2D.

Further, in the following explanation, a direction from the first casing left side face 2C toward the first casing right side face 2D in the first casing 2 and a direction from the first casing right side face 2D toward the first casing left side face 2C, which is opposite to the above direction, are also collectively referred to as a first casing width direction.

Further, in the following explanation, one end of the second casing 3 is also referred to as a second casing one end and the other end on the opposite side to the second casing one end in the second casing 3 is also referred to as a second casing other end.

Further, in the following explanation, a direction from the second casing one end toward the second casing other end in the second casing 3 and a direction from the second casing other end toward the second casing one end, which is opposite to the above direction, are also collectively referred to as a second casing depth direction.

Further, in the following explanation, one face 3A of the second casing 3 is also referred to as a second casing one face 3A and the other face 3B of the second casing 3 is also referred to as a second casing other face 3B.

Further, in the following explanation, a direction from the second casing one face 3A toward the second casing other face 3B in the second casing 3 and a direction from the second casing other face 3B toward the second casing one face 3A, which is opposite to the above direction, are also collectively referred to as a second casing thickness direction.

Further, in the following explanation, a side face 3C on one side of the second casing 3 is also referred to as a second casing left side face 3C and a side face 3D on the other side of the second casing 3 is also referred to as a second casing right side face 3D.

Further, in the following explanation, a direction from the second casing left side face 3C toward the second casing right side face 3D in the second casing 3 and a direction from the second casing right side face 3D toward the second casing left side face 3C, which is opposite to the above direction, are also collectively referred to as a second casing width direction.

In this case, the first casing 2 and the second casing 3 are selected so as to be equal in shape, size, and thickness to each other. Incidentally, in the flowing explanation, all the thicknesses of the first casing 2 and the second casing 3 are also referred to as a casing thickness.

Further, at a central portion of the first casing one face 2A of the first casing 2, a first display section 6 of an approximately flat rectangular shape is disposed over an area from the vicinity (for example, a position several mm away from the first casing one end toward the first casing other end) of the first casing one end to a given position on the first casing other end side in a state where a first display surface 6A is exposed.

Incidentally, in the following explanation, in the first display surface 6A of the first display section 6, one end on the first casing one end side is also referred to as a first display surface one end and the other end on the first casing other end side is also referred to as a first display surface other end.

That is, in the first casing 2, the distance from the first casing one end to the first display surface one end in the central portion of the first casing one face 2A is selected so as to be the above-mentioned several mm, so that the first display section 6 is disposed in a state where the first display surface one end is close to the first casing one end.

Further, a first transparent touch panel 7 is provided on the first display surface 6A of the first display section 6 so as to cover the first display surface 6A. Incidentally, the first display section 6 provided on the first casing one face 2A of the first casing 2 is a liquid crystal display, an organic EL (Electro Luminescence) display, or the like.

On the other hand, in the second casing one face 3A of the second casing 3, an approximately rectangular cutout portion for display section displacement (hereinafter, this is also referred to as a cutout portion for displacement) 3E is formed over an area from the second casing one end to a given position on the second casing other end side.

Further, in the cutout portion for displacement 3E in the second casing one face 3A of the second casing 3, a holding section 8 formed into an approximately rectangular frame shape is provided so as to be able to slide in the second casing depth direction.

Further, the holding section 8 holds a second display section 9 of an approximately flat rectangular shape so as to surround the side face thereof over the entire periphery, thereby exposing a second display surface 9A of the second display section 9 in the second casing one face 3A.

Incidentally, in the following explanation, in the second display surface 9A of the second display section 9, one end on the second casing one end side is also referred to as a second display surface one end and the other end on the second casing other end side is also referred to as a second display surface other end.

Then, in the holding section 8, the depth of a frame portion 8A on the second casing one end side (that is, contacting the second display surface one end) among four frame portions 8A to 8D surrounding the side face of the second display section 9 over the entire periphery is selected so as to be several mm that is equal to the distance from the first casing one end to the first display surface one end. Incidentally, in the following explanation, the frame portion 8A on the second casing one end side among the four frame portions 8A to 8D of the holding section 8 is also referred to as a one end-side frame portion 8A.

Accordingly, for example, when the first casing 2 and the second casing 3 are opened at an angle of 180 degrees such that the first casing one face 2A and the second casing one face 3A line up, the holding section 8 slides to the second casing one end side, thereby being able to bring the second display surface one end close to the first display surface one end.

That is, for example, when the first casing 2 and the second casing 3 are opened at an angle of 180 degrees, the holding section 8 brings the second display surface 9A close to the first display surface 6A, thereby allowing these display surfaces to be disposed as if they were one display surface.

Further, on the second display surface 9A of the second display section 9, a second transparent touch panel 10 is provided so as to cover the second display surface 9A. Incidentally, the second display section 9 provided on one face 3A of the second casing 3 is also a liquid crystal display, an organic EL display, or the like.

Then, in the inside of at least one of the first casing 2 and the second casing 3, various circuit sections (not shown) such as a control section, a storage section, or the like are housed, and the control section is electrically connected to other circuit sections.

Further, the control section is also appropriately electrically connected to the first display section 6, the second display section 9, the first touch panel 7, and the second touch panel 10. Accordingly, for example, the control section can individually display different types of images on the first display surface 6A of the first display section 6 and the second display surface 9A of the second display section 9.

Further, for example, the control section can also divide a single image into two and display the two divided images on the first display surface 6A of the first display section 6 and the second display surface 9A of the second display section 9.

That is, for example, when the first casing 2 and the second casing 3 have been opened up to about 180 degrees, the control section can display a single image over the first and second display surfaces 6A and 9A by using the first and second display surfaces 6A and 9A as if they were one display surface.

Further, if the surfaces of the first and second touch panels 7 and 10 are subjected to a touch operation in a state where images are displayed on the first display surface 6A of the first display section 6 and the second display surface 9A of the second display section 9, the control section executes processing according to the touch operation.

In fact, the control section can display an image with various operation keys arranged as icons (hereinafter, this is also referred to as a keyboard image) on the first display surface 6A of the first display section 6.

Then, if in a state where the keyboard image is displayed on the first display surface 6A of the first display section 6, the surface of the first touch panel 7 is subjected to a touch operation, thereby indicating an icon, the control section executes processing assigned in advance to the icon indicated by the touch operation.

That is, the control section makes the first display surface 6A function along with the first touch panel 7 as if it were a hardware keyboard, thereby switching an image that is displayed on the second display surface 9A, in accordance with an operation on the keyboard (keyboard image), and updating the contents of the image.

1-2. Detailed Configuration of Folding-type Electronic Apparatus

Figure 2:
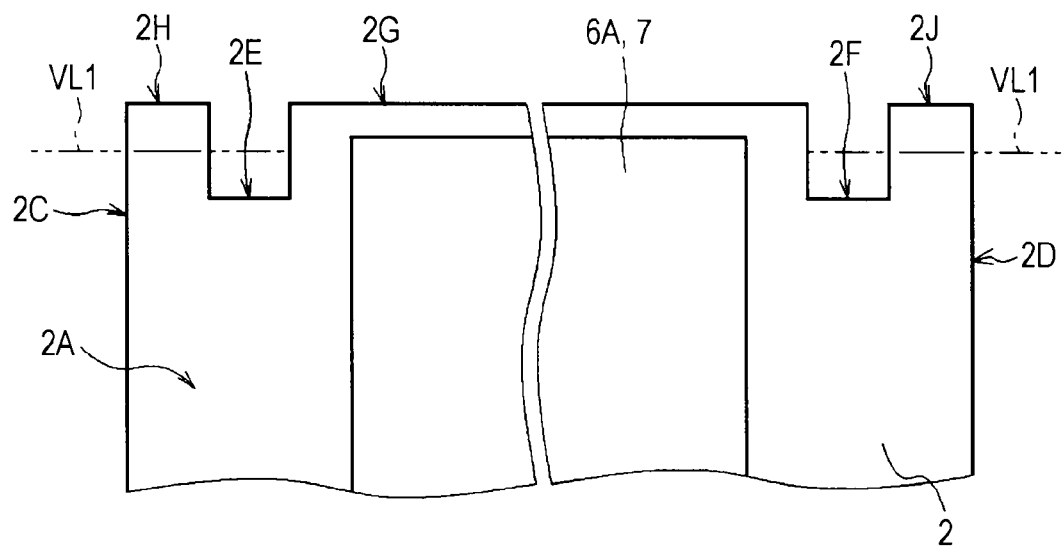
FIG. 2 is a diagrammatic plan view illustrating the configuration of a cutout portion for a hinge of a first casing.
Figure 3:
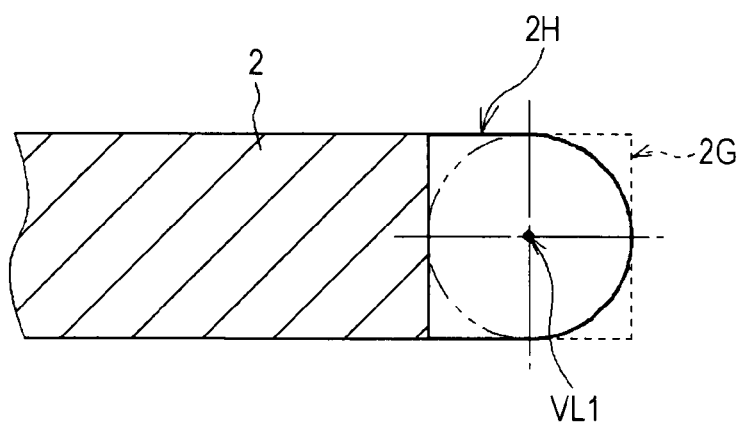
FIG. 3 is a diagrammatic cross-sectional view illustrating the configuration of a shaft formation portion of the first casing.

Next, the configuration of the folding-type electronic apparatus 1 will be described in detail. As shown in FIGS. 2 and 3, in a first casing one end portion of the first casing 2, a cutout portion for a hinge 2E which has a width approximately equal to the width of a first hinge section 4 and in which the depth thereof from the first casing one end to the first casing other end side is approximately equal to the casing thickness is formed at a given position near the first casing left side face 2C.

Incidentally, in the following explanation, the cutout portion for a hinge 2E formed at a given position near the first casing left side face 2C in the first casing one end portion is also referred to as a first casing left cutout portion 2E.

Further, in the first casing one end portion of the first casing 2, a cutout portion for a hinge 2F which has a width approximately equal to the width of a second hinge section 5 and in which the depth thereof from the first casing one end to the first casing other end side is approximately equal to the casing thickness is also formed at a given position near the first casing right side face 2D.

Incidentally, in the following explanation, the cutout portion for a hinge 2F formed at a given position near the first casing right side face 2D in the first casing one end portion is also referred to as a first casing right cutout portion 2F.

Then, the portion between the first casing left cutout portion 2E and the first casing right cutout portion 2F in the first casing one end is formed into a planar shape in which an end face (that is, an end face of the first casing one end) 2G contacts the first casing one face 2A and the first casing other face 2B at right angles.

Incidentally, in the following explanation, the portion between the first casing left cutout portion 2E and the first casing right cutout portion 2F in the first casing one end is also referred to as a first casing one end central portion and the end face 2G of the first casing one end central portion is also referred to as a first casing one end face 2G.

Further, a portion 2H further on the first casing left side face 2C side than the first casing left cutout portion 2E in the first casing one end portion becomes a shaft formation portion in which a turning shaft when turning the first casing 2 with respect to the second casing 3 is formed as will be described later.

Incidentally, in the following explanation, the portion 2H, that is, the shaft formation portion, further on the first casing left side face 2C side than the first casing left cutout portion 2E in the first casing one end portion is also referred to as a first left shaft formation portion 2H.

In the first left shaft formation portion 2H, an end face thereof on the first casing one end side is formed into an arc shape which follows a side face corresponding to the semi-circle of a cylinder, the radius of which is a distance of ½ of the casing thickness, centering around a virtual line VL1 that is located in parallel with the first casing width direction and at a distance of ½ of the casing thickness from the center of the end face.

Further, a portion 2J further on the first casing right side face 2D side than the first casing right cutout portion 2F in the first casing one end portion also becomes a shaft formation portion in which a turning shaft when turning the first casing 2 with respect to the second casing 3 is formed as will be described later.

Incidentally, in the following explanation, the portion 2J, that is, the shaft formation portion, further on the first casing right side face 2D side than the first casing right cutout portion 2F in the first casing one end portion is also referred to as a first right shaft formation portion 2J.

Also in the first right shaft formation portion 2J, an end face thereof on the first casing one end side is formed into an arc shape which follows a side face corresponding to the semi-circle of a cylinder, the radius of which is a distance of ½ of the casing thickness, centering around the above-mentioned virtual line VL1, similarly to the first left shaft formation portion 2H.

Figure 4:
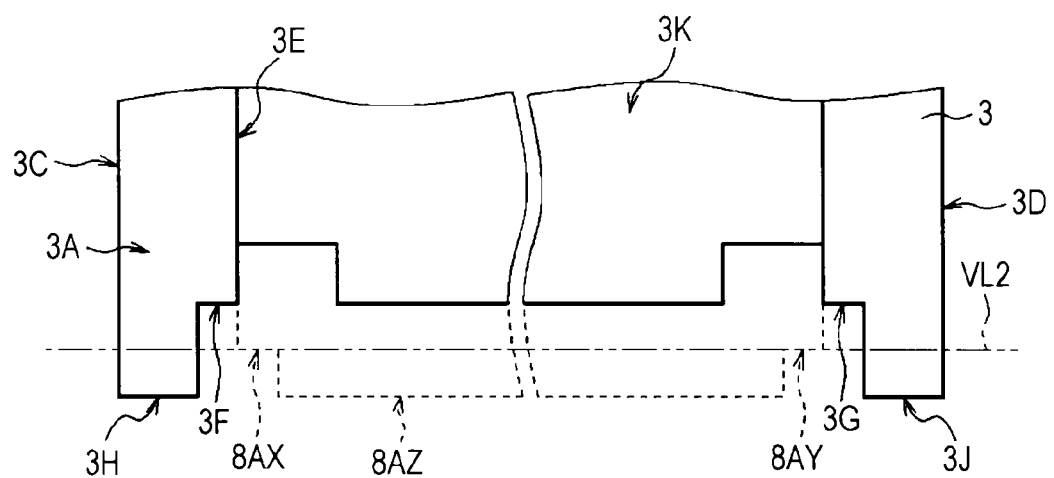
FIG. 4 is a diagrammatic plan view illustrating the configurations of a cutout portion for a hinge and a cutout portion for displacement of a second casing.
Figure 5:
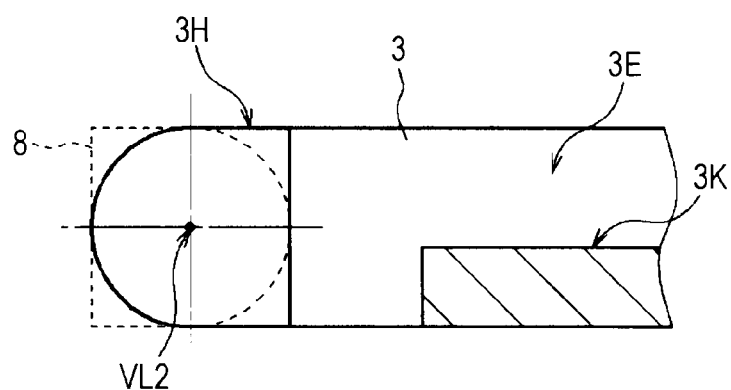
FIG. 5 is a diagrammatic cross-sectional view illustrating the configuration of a shaft formation portion of the second casing.

On the other hand, as shown in FIGS. 4 and 5, in the second casing one face 3A of the second casing 3, the cutout portion for displacement 3E wider than the second display surface 9A is formed, as described above.

However, at the second casing other end side, the cutout portion for displacement 3E is formed so as to leave a bottom plate 3K of the second casing 3. Further, at the second casing one end side, the cutout portion for displacement 3E is formed such that the bottom plate 3K of the second casing 3 is removed in an approximately U shape from the second casing one end to the second casing other end side.

In a second casing one end portion of the second casing 3, a cutout portion for a hinge 3F which has a width approximately equal to the width of the first hinge section 4 and in which the depth thereof from the second casing one end to the second casing other end side is approximately equal to the casing thickness is formed at a given position near the second casing left side face 3C, which faces the first casing left cutout portion 2E.

Incidentally, in the following explanation, the cutout portion for a hinge 3F formed at a given position near the second casing left side face 3C in the second casing one end portion is also referred to as a second casing left cutout portion 3F.

In this case, the second casing left cutout portion 3F is formed so as to face the above-mentioned first casing left cutout portion 2E at a portion actually cut out in the second casing one end portion and a portion related to the left side of the cutout portion for displacement 3E.

Further, in the second casing one end portion of the second casing 3, a cutout portion for a hinge 3G in which the depth thereof from the second casing one end to the second casing other end side is approximately equal to the casing thickness is also formed facing the above-mentioned first casing right cutout portion 2F at a given position near the second casing right side face 3D.

Incidentally, in the following explanation, the cutout portion for a hinge 3G formed at a given position near the second casing right side face 3D in the second casing one end portion is also referred to as a second casing right cutout portion 3G.

In this case, the second casing right cutout portion 3G is formed so as to face the above-mentioned first casing right cutout portion 2F at a portion actually cut out in the second casing one end portion and a portion related to the right side of the cutout portion for displacement 3E.

Then, a portion 3H further on the second casing left side face 3C side than the second casing left cutout portion 3F in the second casing one end portion becomes a shaft formation portion in which a turning shaft when turning the second casing 3 with respect to the first casing 2 is formed as will be described later.

Incidentally, in the following explanation, the portion 3H, that is, the shaft formation portion, further on the second casing left side face 3C side than the second casing left cutout portion 3F in the second casing one end portion is also referred to as a second left shaft formation portion 3H.

In the second left shaft formation portion 3H, an end face thereof on the second casing one end side is formed into an arc shape which follows a side face corresponding to the semicircle of a cylinder, the radius of which is a distance of ½ of the casing thickness, centering around a virtual line VL2 that is located in parallel with the second casing width direction and at a distance of ½ of the casing thickness from the center of the end face.

Further, a portion 3J further on the second casing right side face 3D side than the second casing right cutout portion 3G in the second casing one end portion also becomes a shaft formation portion in which a turning shaft when turning the second casing 3 with respect to the first casing 2 is formed as will be described later.

Incidentally, in the following explanation, the portion 3J, that is, the shaft formation portion, further on the second casing right side face 3D side than the second casing right cutout portion 3G in the second casing one end portion is also referred to as a second right shaft formation portion 3J.

Also in the second right shaft formation portion 3J, an end face thereof on the second casing one end side is formed into an arc shape which follows a side face corresponding to the semicircle of a cylinder, the radius of which is a distance of ½ of the casing thickness, centering around the above-mentioned virtual line VL2, similarly to the second left shaft formation portion 3H.

Further, in the holding section 8, a cutout portion (hereinafter, this is also referred to as a left cutout portion) 8AX having a depth equal to ½ of the casing thickness is formed in a left end portion facing the above-mentioned first casing left cutout portion 2E in the one end-side frame portion 8A.

Further, in the holding section 8, a cutout portion (hereinafter, this is also referred to as a right cutout portion) 8AY having a depth equal to ½ of the casing thickness is also formed in a right end portion facing the above-mentioned first casing right cutout portion 2F in the one end-side frame portion 8A.

Further, in the holding section 8, an end face (that is, an end face on the first casing one end side and hereinafter, this is also referred to as a holding section one end face) 8AZ of the one end-side frame portion 8A is formed into a planar shape contacting the upper and lower surfaces of the one end-side frame portion 8A at right angles.

Figure 6:
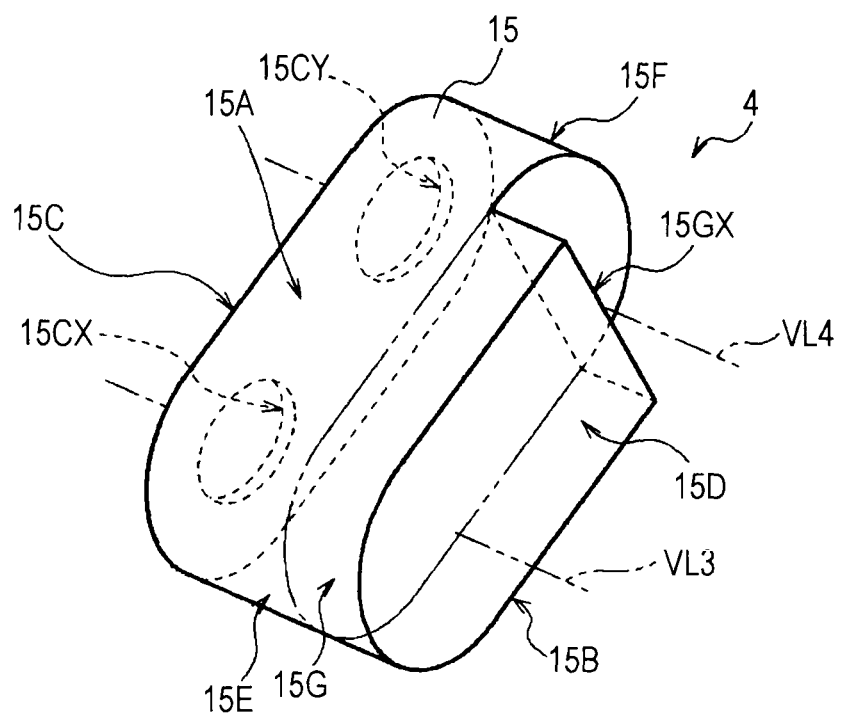
FIG. 6 is a diagrammatic perspective view illustrating the appearance configuration of a first hinge section.

As shown in FIG. 6, the first hinge section 4 has a first hinge case 15 in which the thickness from one face 15A to the other face 15B is equal to the casing thickness and the distance from a side face 15C on one side to a side face 15D on the other side becomes the width of the above-mentioned first hinge section 4.

Incidentally, in the following explanation, one face 15A in the first hinge case 15 is also referred to as a first hinge one face 15A and the other face 15B in the first hinge case 15 is also referred to as a first hinge other face 15B.

Further, in the following explanation, the thickness from the first hinge one face 15A to the first hinge other face 15B in the first hinge case 15 of the first hinge section 4 is also referred to as a first hinge thickness.

Then, in the following explanation, a direction from the first hinge one face 15A toward the first hinge other face 15B in the first hinge section 4 and a direction from the first hinge other face 15B toward the first hinge one face 15A, which is opposite to the above direction, are also collectively referred to as a first hinge section thickness direction.

Further, in the following explanation, the side face 15C on one side in the first hinge case 15 is also referred to as a first hinge left side face 15C and the side face 15D on the other side in the first hinge case 15 is also referred to as a first hinge right side face 15D.

Then, in the following explanation, a direction from the first hinge left side face 15C toward the first hinge right side face 15D in the first hinge section 4 and a direction from the first hinge right side face 15D toward the first hinge left side face 15C, which is opposite to the above direction, are also collectively referred to as a first hinge section width direction.

In the first hinge case 15, an end face 15E of one end is formed into an arc shape which follows a side face corresponding to the semicircle of a cylinder, the radius of which is a distance of ½ of the casing thickness, centering around a virtual line VL3 that is located in parallel with the first hinge section width direction at a distance of ½ of the casing thickness from the center of the end face 15E.

Further, in the first hinge case 15, an end face 15F of the other end is formed into an arc shape which follows a side face corresponding to the semicircle of a cylinder, the radius of which is a distance of ½ of the casing thickness, centering around a virtual line VL4 that is located in parallel with the first hinge section width direction at a distance of ½ of the casing thickness from the center of the end face 15F.

Incidentally, in the following explanation, one end of the first hinge case 15 is also referred to as a first hinge one end and the other end of the first hinge case 15 is also referred to as a first hinge other end.

Then, in the following explanation, a direction from the top of the end face 15E of the first hinge one end in the first hinge section 4 toward the top of the end face 15F of the first hinge other end and a direction opposite to the direction are also collectively referred to as a first hinge section longitudinal direction.

Then, in the first hinge case 15, the length from the top of the arc-shaped end face 15E of the first hinge one end to the top of the arc-shaped end face 15F of the first hinge other end is selected so as to be approximately equal to a length of two times the casing thickness.

Incidentally, in the following explanation, the length from the top of the arc-shaped end face 15E of the first hinge one end in the first hinge case 15 to the top of the arc-shaped end face 15F of the first hinge other end is also referred to as a first hinge length.

Further, in the first hinge case 15, a cutout portion in which the depth thereof from the first hinge other end to the first hinge one end side is equal to ½ of the casing thickness is formed at the first hinge right side face 15D side in a first hinge other end portion.

In this case, a portion on the first hinge right side face 15D side in the first hinge case 15 becomes a cam portion (hereinafter, this is also referred to as a first cam portion) 15G for displacing the holding section 8 in accordance with opening and closing of the first casing 2 and the second casing 3.

That is, a portion having a length of about 1.5 times the casing thickness, from the top of the arc-shaped end face 15E of the first hinge one end in the first hinge case 15 to a bottom face (hereinafter, this is also referred to as a first cam end face) 15GX of the cutout portion, becomes the first cam portion 15G. Then, the width of the first cam portion 15G (the width of the first cam end face 15GX) is selected so as to be equal to the width of the left cutout portion 8AX of the holding section 8.

Further, in the first hinge case 15, the width of the portion further on the left side than the first cam portion 15G is selected so as to be approximately equal to the width of the portion actually cut out as the second casing left cutout portion 3F in the second casing one end portion of the second casing 3.

Further, in the first hinge left side face 15C in the first hinge case 15, a circular one end-side hole portion 15CX centering on the virtual line VL3 and having a given radius is perforated at the first hinge one end side.

Further, in the first hinge left side face 15C in the first hinge case 15, a circular other end-side hole portion 15CY centering on the virtual line VL4 and having the same radius as the one end-side hole portion 15CX is perforated at the first hinge other end side.

Figure 7:
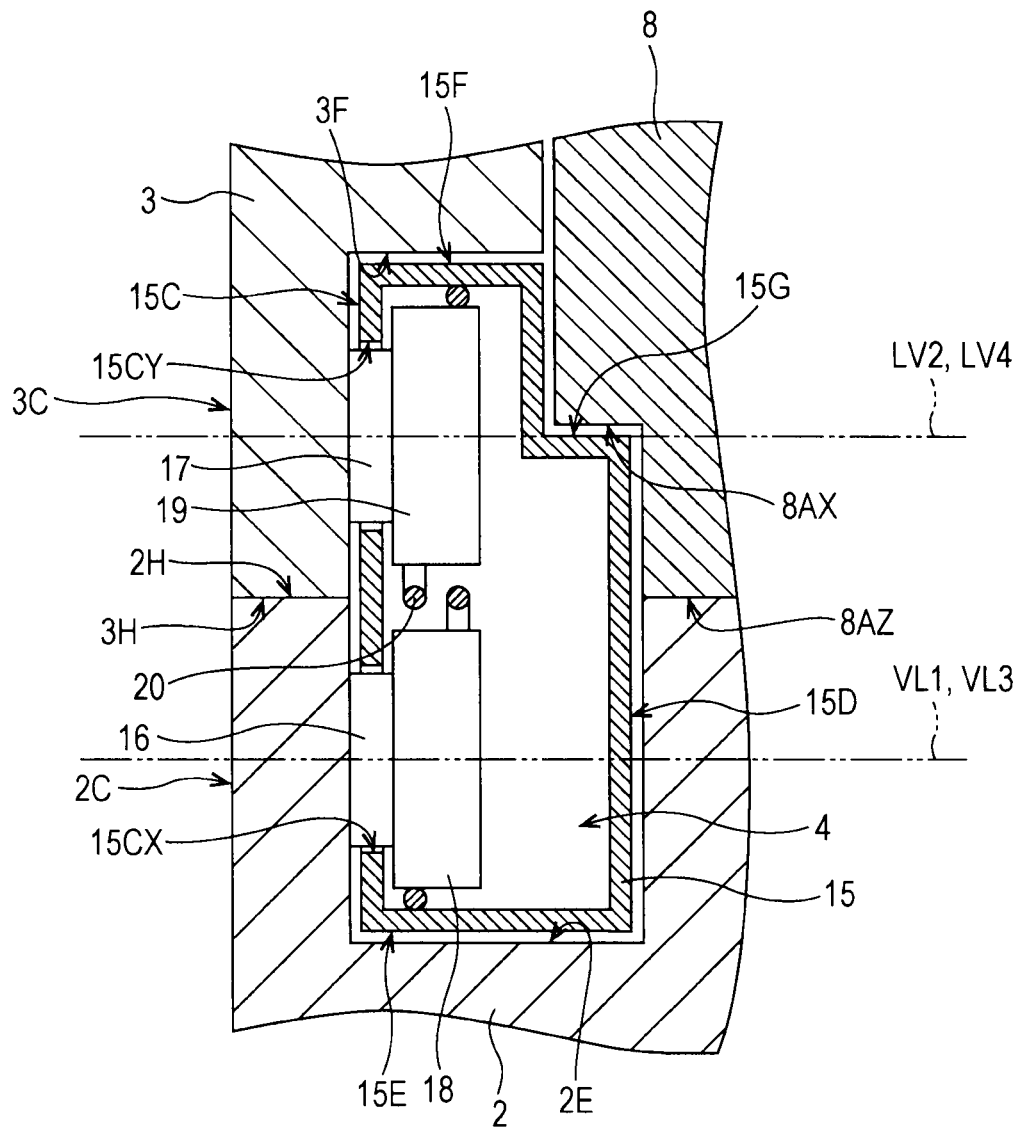
FIG. 7 is a diagrammatic cross-sectional view illustrating the internal configuration (1) of the first hinge section.
Figure 8:
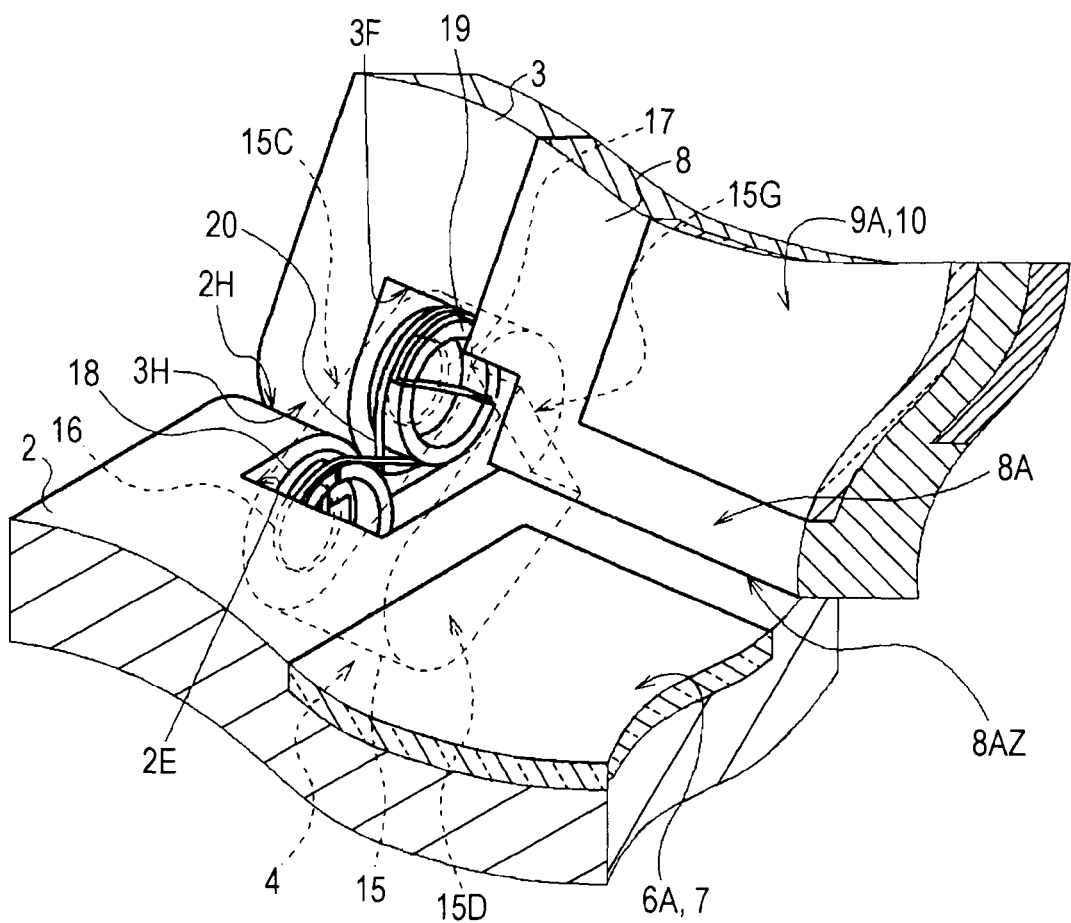
FIG. 8 is a diagrammatic cross-sectional view illustrating the internal configuration (2) of the first hinge section.
Figure 9:
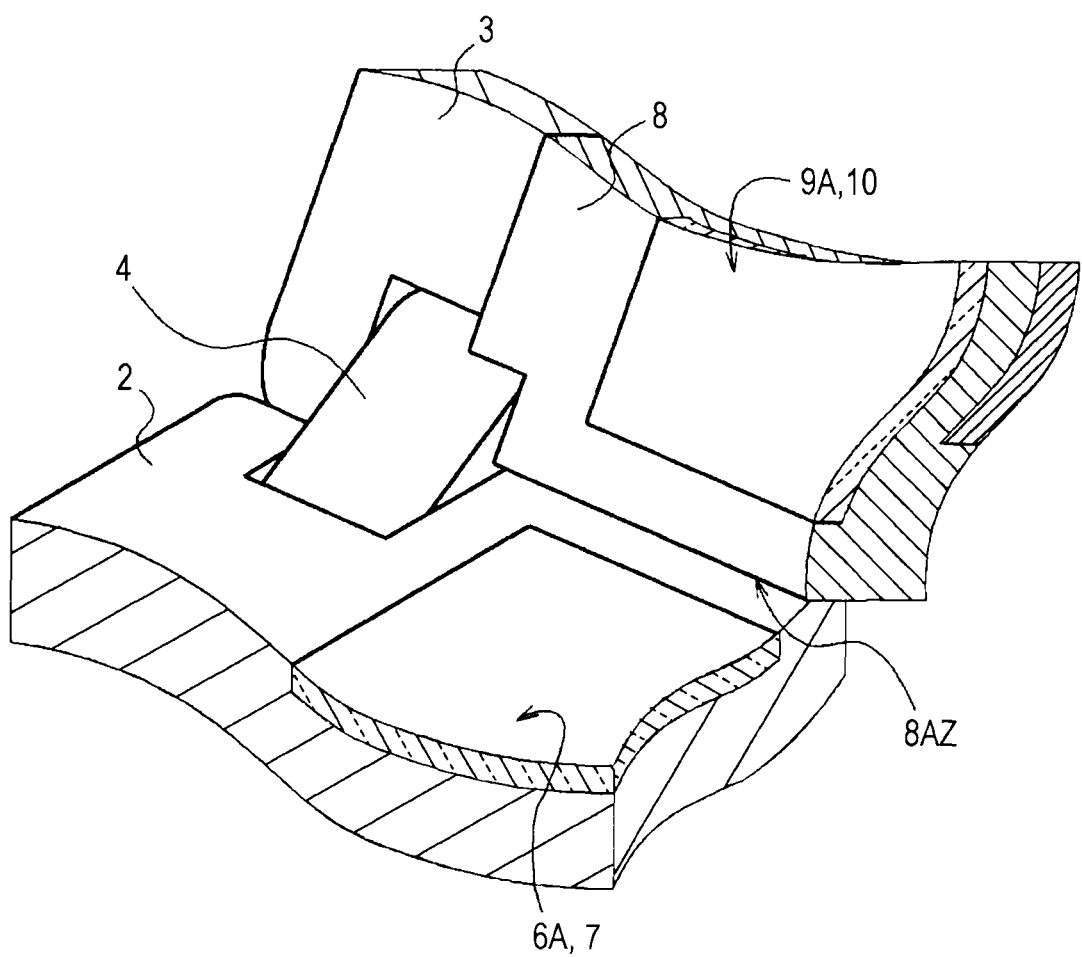
FIG. 9 is a diagrammatic perspective view for explanation of connection of the first casing and the second casing by the first hinge section.

Then, as shown in FIGS. 7 to 9, the first hinge section 4 has two first and second cylindrical turning shafts 16 and 17 each having a radius approximately equal to that of the one end-side hole portion 15CX. Further, the first hinge section 4 also has two first and second disc-shaped pulleys 18 and 19 housed in the first hinge case 15.

Incidentally, FIG. 7 shows a state where the first casing 2 and the second casing 3 are opened at an angle of 180 degrees such that the first casing one face 2A and the second casing one face 3A line up (hereinafter, this is also referred to as a spread state). Further, FIGS. 8 and 9 show a state where the first casing 2 and the second casing 3 are opened at an angle of about 120 degrees.

In the first hinge case 15, the first turning shaft 16 is inserted into the one end-side hole portion 15CX of the first hinge case 15 so as to be able to turn around the virtual line VL3.

Then, one end protruding to the outside of the first hinge case 15 in the first turning shaft 16 is fixed to an inner wall of the first left shaft formation portion 2H of the first casing 2 in a state where the virtual line VL3 which becomes the center of turning of the first turning shaft 16 corresponds with the virtual line VL1.

Further, the other end entered into the first hinge case 15 in the first turning shaft 16 is fixed to a central portion of one face of the first pulley 18 in a state where the virtual line VL3 corresponds with the central axis of the first pulley 18.

Further, in the first hinge case 15, the second turning shaft 17 is inserted into the other end-side hole portion 15CY of the first hinge case 15 in parallel with the first turning shaft 16 so as to be able to turn around the virtual line VL4.

One end protruding to the outside of the first hinge case 15 in the second turning shaft 17 is fixed to an inner wall of the second left shaft formation portion 3H of the second casing 3 in a state where the virtual line VL4 which becomes the center of turning of the second turning shaft 17 corresponds with the virtual line VL2.

Further, the other end entered into the first hinge case 15 in the second turning shaft 17 is fixed to a central portion of one face of the second pulley 19 in a state where the virtual line VL4 corresponds with the central axis of the second pulley 19.

In this way, in the first hinge section 4, at the time of opening and closing of the first casing 2 and the second casing 3, in conjunction with the opening and closing, the first pulley 18 turns along with the first turning shaft 16 in the first hinge case 15 and the second pulley 19 also turns along with the second turning shaft 17.

Further, in the first hinge section 4, a wire 20 is wound in a figure of eight from a side face of the first pulley 18 to a side face of the second pulley 19. Then, one portion of the wire 20 is led and fixed to the other face of the first pulley 18 and the other portion is led and fixed to the other face of the second pulley 19.

Incidentally, at the time of assembly of the electronic apparatus 1, the wire 20 is wound around and fixed to the first pulley 18 and the second pulley 19, for example, in a state where the first casing 2 and the second casing 3 are opened at an angle of 180 degrees, whereby an end face of the first left shaft formation portion 2H and an end face of the second left shaft formation portion 3H come into contact with each other.

In this way, in the first hinge section 4, at the time of opening and closing of the first casing 2 and the second casing 3, the first pulley 18 and the second pulley 19 turn relative to each other in the opposite directions in synchronization with each other without sliding of the wire 20 on the side faces of the first and second pulleys 18 and 19.

That is, in the first hinge section 4, at the time of opening and closing of the first casing 2 and the second casing 3, turning only of the second turning shaft 17 and the second pulley 19 with respect to the first turning shaft 16 and the first pulley 18 is prevented.

Further, in the first hinge section 4, at the time of opening and closing of the first casing 2 and the second casing 3, turning only of the first turning shaft 16 and the first pulley 18 with respect to the second turning shaft 17 and the second pulley 19 is also prevented.

In this way, the first hinge section 4 connects the left side of the first casing one end portion of the first casing 2 and the left side of the second casing one end portion of the second casing 3, thereby allowing the first casing 2 and the second casing 3 to be opened and closed.

Figure 10:
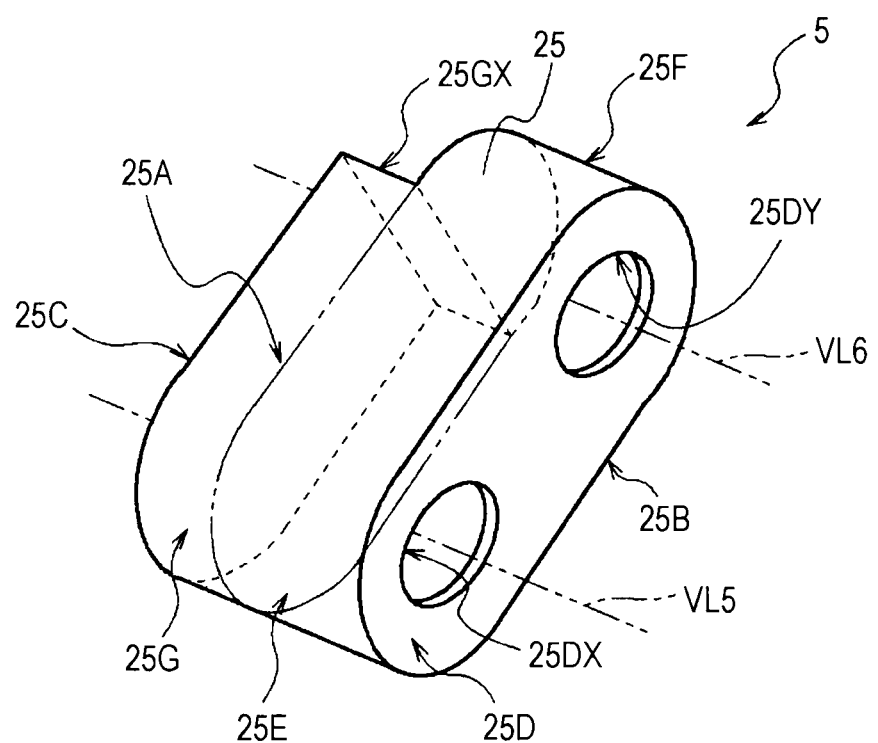
FIG. 10 is a diagrammatic perspective view illustrating the appearance configuration of a second hinge section.

On the other hand, as shown in FIG. 10, the second hinge section 5 has a second hinge case 25 having a plane-symmetrical shape to the first hinge case 15 of the first hinge section 4. That is, in the second hinge case 25, the thickness from one face 25A to the other face 25B is selected so as to be equal to the casing thickness and the distance from a side face 25C on one side to a side face 25D on the other side becomes the width of the above-mentioned second hinge section 5.

Incidentally, in the following explanation, one face 25A in the second hinge case 25 is also referred to as a second hinge one face 25A and the other face 25B in the second hinge case 25 is also referred to as a second hinge other face 25B.

Further, in the following explanation, the thickness from the second hinge one face 25A to the second hinge other face 25B in the second hinge case 25 of the second hinge section 5 is also referred to as a second hinge thickness.

Then, in the following explanation, a direction from the second hinge one face 25A toward the second hinge other face 25B in the second hinge section 5 and a direction from the second hinge other face 25B toward the second hinge one face 25A, which is opposite to the above direction, are also collectively referred to as a second hinge section thickness direction.

Further, in the following explanation, the side face 25C on one side in the second hinge case 25 is also referred to as a second hinge left side face 25C and the side face 25D on the other side in the second hinge case 25 is also referred to as a second hinge right side face 25D.

Then, in the following explanation, a direction from the second hinge left side face 25C toward the second hinge right side face 25D in the second hinge section 5 and a direction from the second hinge right side face 25D toward the second hinge left side face 25C, which is opposite to the above direction, are also collectively referred to as a second hinge section width direction.

In the second hinge case 25, an end face 25E of one end is formed into an arc shape which follows a side face corresponding to the semicircle of a cylinder, the radius of which is a distance of ½ of the casing thickness, centering around a virtual line VL5 that is located in parallel with the second hinge section width direction at a distance of ½ of the casing thickness from the center of the end face 25E.

Further, in the second hinge case 25, an end face 25F of the other end is formed into an arc shape which follows a side face corresponding to the semicircle of a cylinder, the radius of which is a distance of ½ of the casing thickness, centering around a virtual line VL6 that is located in parallel with the second hinge section width direction at a distance of ½ of the casing thickness from the center of the end face 25F.

Incidentally, in the following explanation, one end of the second hinge case 25 is also referred to as a second hinge one end and the other end of the second hinge case 25 is also referred to as a second hinge other end.

Then, in the following explanation, a direction from the top of the end face 25E of the second hinge one end in the second hinge section 5 toward the top of the end face 25F of the second hinge other end and a direction opposite to the direction are also collectively referred to as a second hinge section longitudinal direction.

Then, in the second hinge case 25, the length from the top of the arc-shaped end face 25E of the second hinge one end to the top of the arc-shaped end face 25F of the second hinge other end is selected so as to be approximately equal to a length of two times the casing thickness.

Incidentally, in the following explanation, the length from the top of the arc-shaped end face 25E of the second hinge one end in the second hinge case 25 to the top of the arc-shaped end face 25F of the second hinge other end is also referred to as a second hinge length.

Further, in the second hinge case 25, a cutout portion in which the depth thereof from the second hinge other end to the second hinge one end side is equal to ½ of the casing thickness is formed at the second hinge left side face 25C side in a second hinge other end portion.

In this case, the portion on the second hinge left side face 25C side in the second hinge case 25 becomes a cam portion (hereinafter, this is also referred to as a second cam portion) 25G for displacing the holding section 8 in accordance with opening and closing of the first casing 2 and the second casing 3.

That is, the portion having a length of about 1.5 times the casing thickness, from the top of the arc-shaped end face 25E of the second hinge one end in the second hinge case 25 to a bottom face (hereinafter, this is also referred to as a second cam end face) 25GX of the cutout portion, becomes the second cam portion 25G. Then, the width of the second cam portion 25G (the width of the second cam end face 25GX) is selected so as to be equal to the width of the right cutout portion 8AY of the holding section 8.

Further, in the second hinge case 25, the width of the portion further on the right side than the second cam portion 25G is selected so as to be approximately equal to the width of a portion actually cut out as the second casing right cutout portion 3G in the second casing one end portion of the second casing 3.

Further, in the second hinge right side face 25D in the second hinge case 25, a circular one end-side hole portion 25DX centering on the virtual line VL5 and having the same radius as the above-mentioned one end-side hole portion 15CX is perforated at the second hinge one end side.

Further, in the second hinge right side face 25D in the second hinge case 25, a circular other end-side hole portion 25DY centering on the virtual line VL6 and having the same radius as the above-mentioned one end-side hole portion 15CX is perforated at the second hinge other end side.

Figure 11:
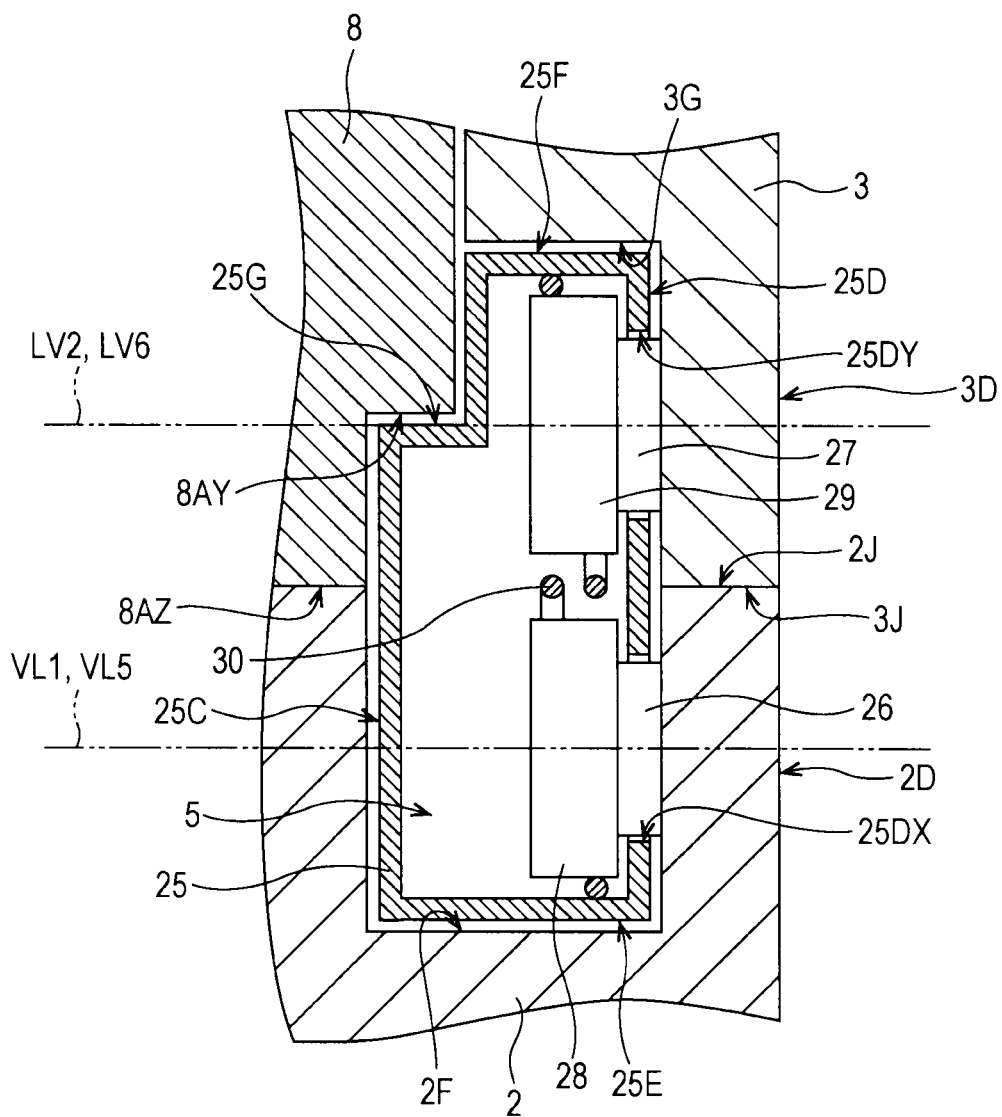
FIG. 11 is a diagrammatic cross-sectional view illustrating the internal configuration (1) of the second hinge section.
Figure 12:
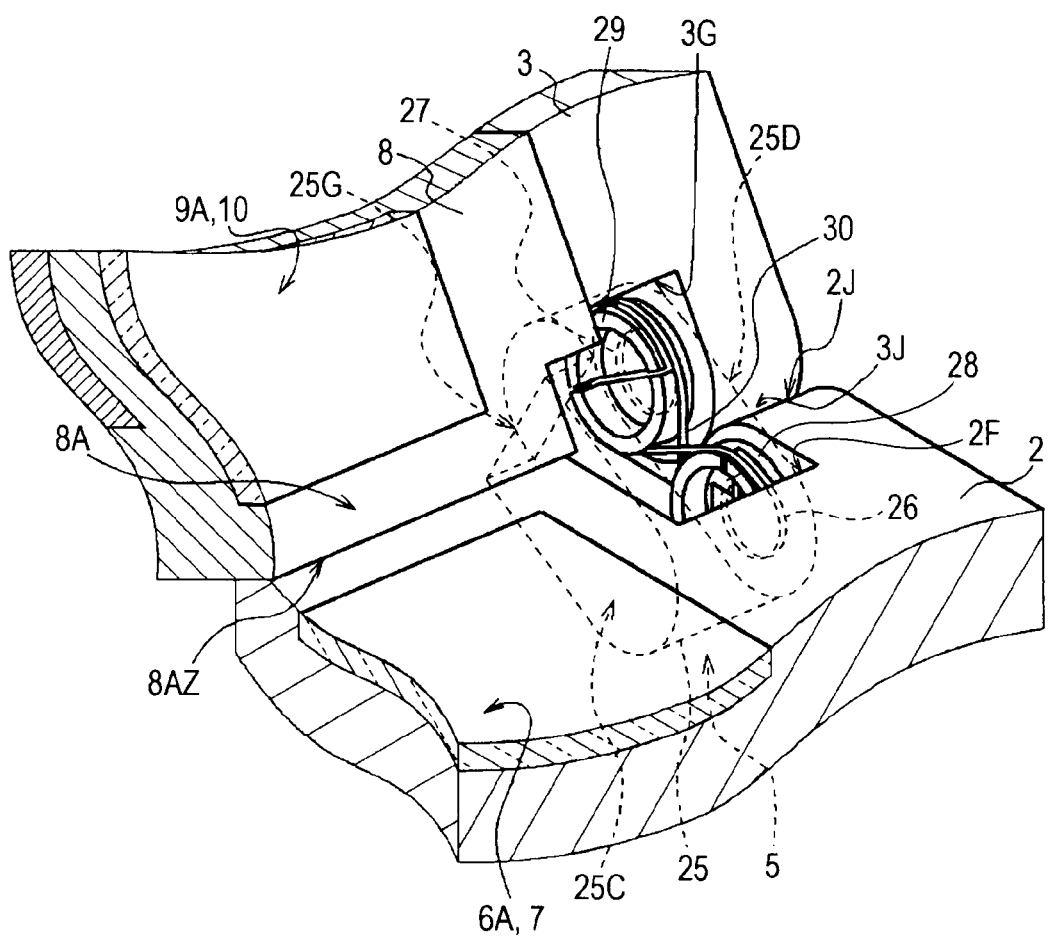
FIG. 12 is a diagrammatic cross-sectional view illustrating the internal configuration (2) of the second hinge section.
Figure 13:
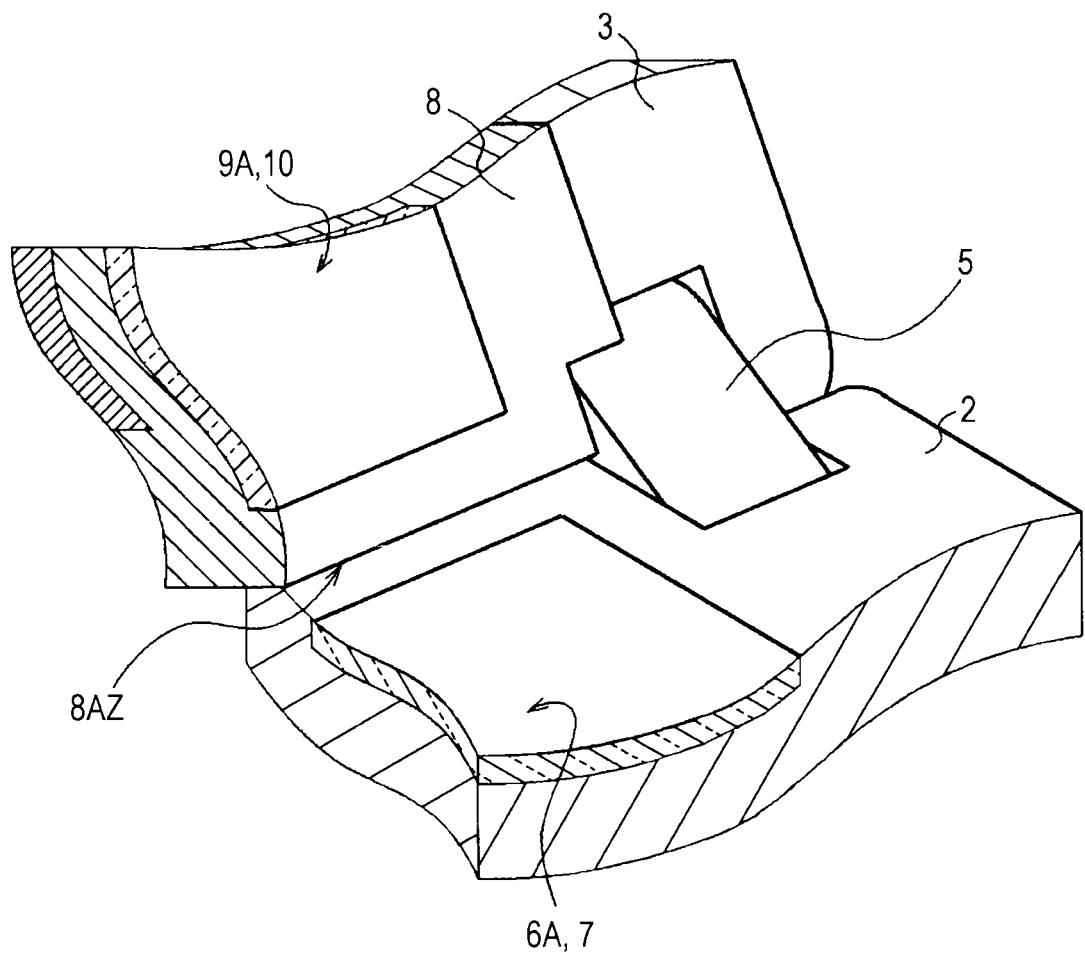
FIG. 13 is a diagrammatic perspective view for explanation of connection of the first casing and the second casing by the second hinge section.
Figure 14A:
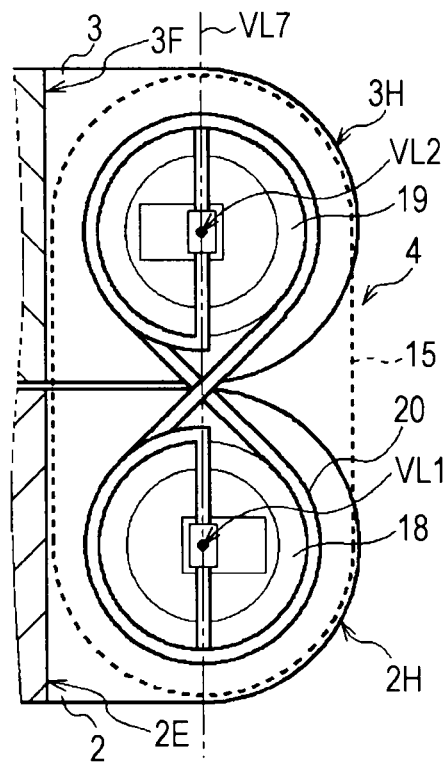
FIGS. 14A and 14B are diagrammatic diagrams for explanation of changes (1) in the positions of the first hinge section and the second hinge section at the time of opening and closing of the first casing and the second casing.
Figure 14B:
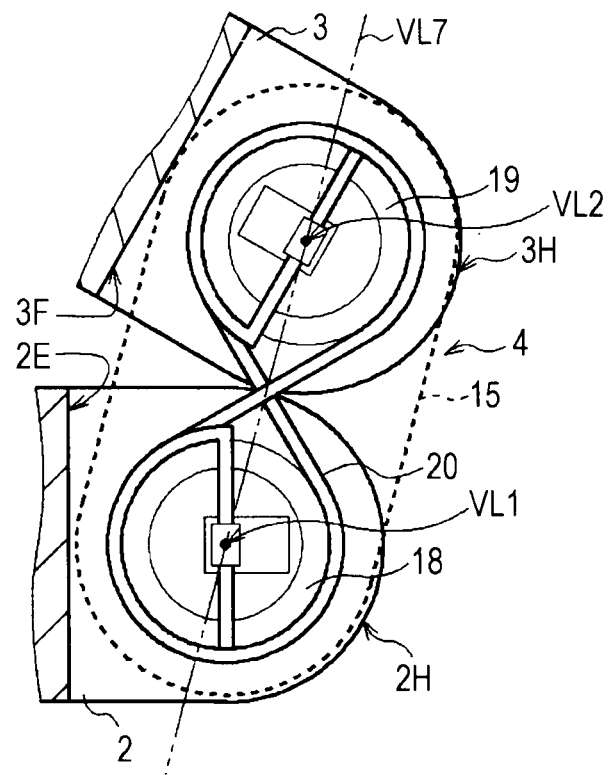
Figure 15A:
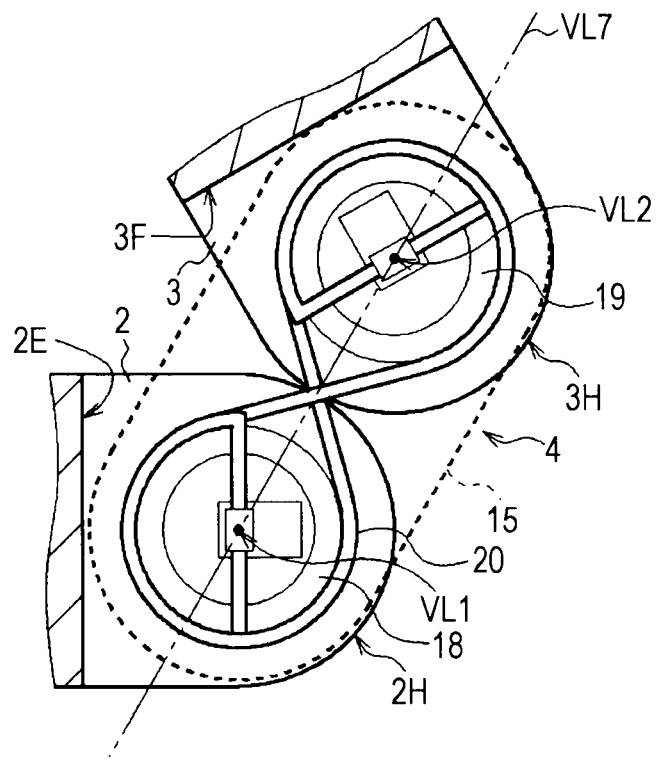
FIGS. 15A and 15B are diagrammatic diagrams for explanation of changes (2) in the positions of the first hinge section and the second hinge section at the time of opening and closing of the first casing and the second casing.
Figure 15B:
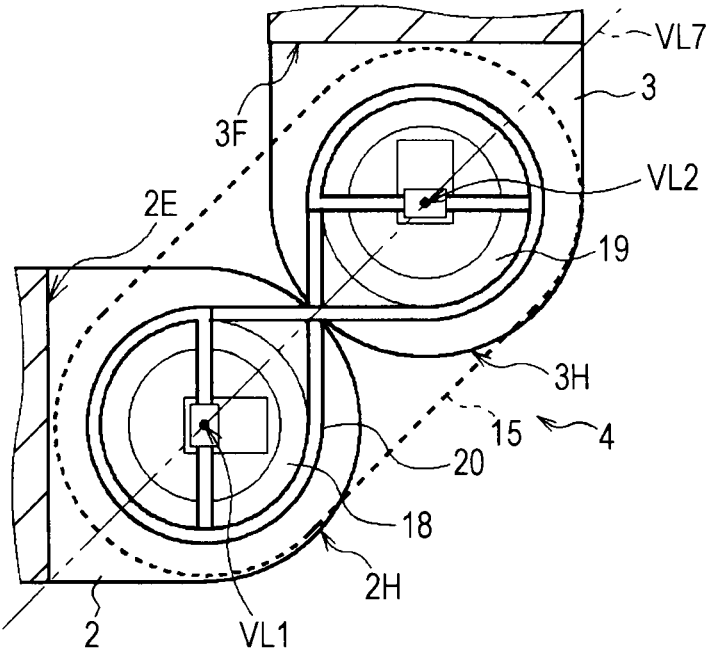
Figure 16A:
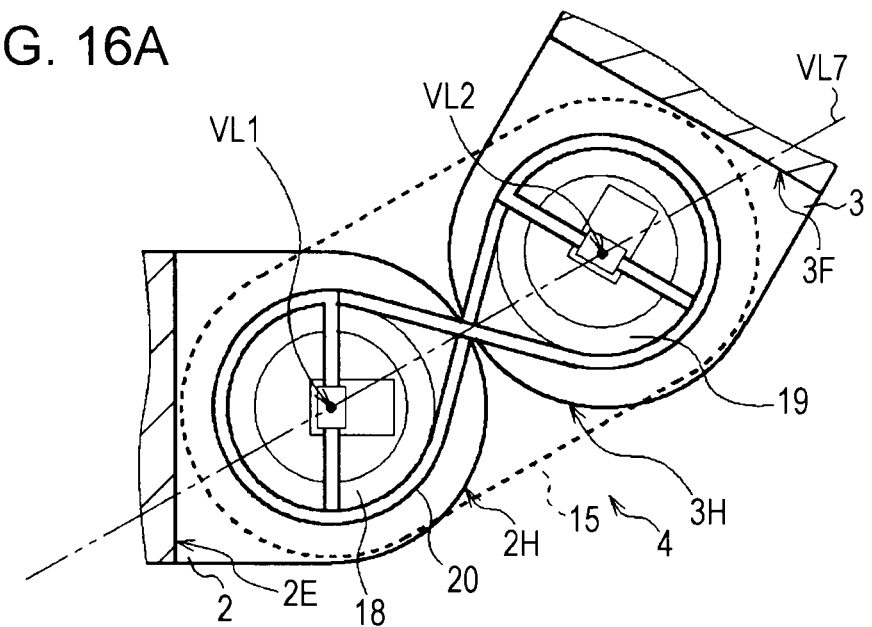
FIGS. 16A and 16B are diagrammatic diagrams for explanation of changes (3) in the positions of the first hinge section and the second hinge section at the time of opening and closing of the first casing and the second casing.
Figure 16B:
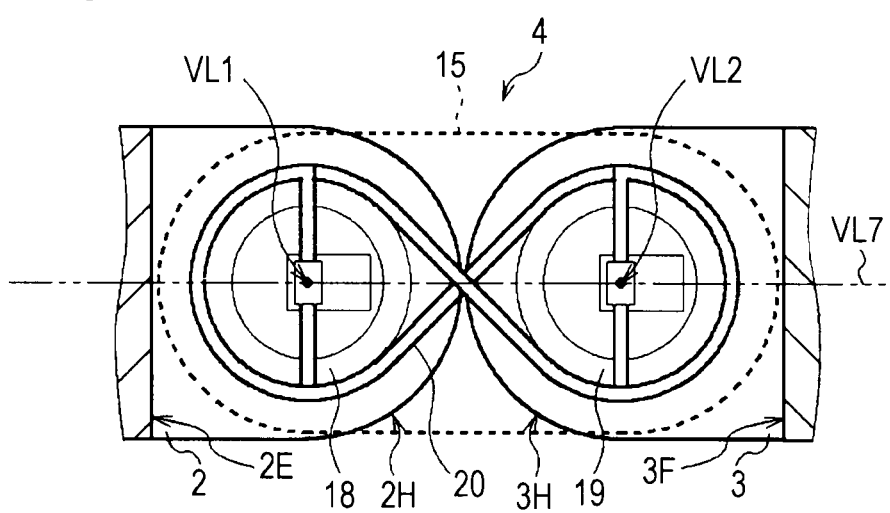
Figure 17A:
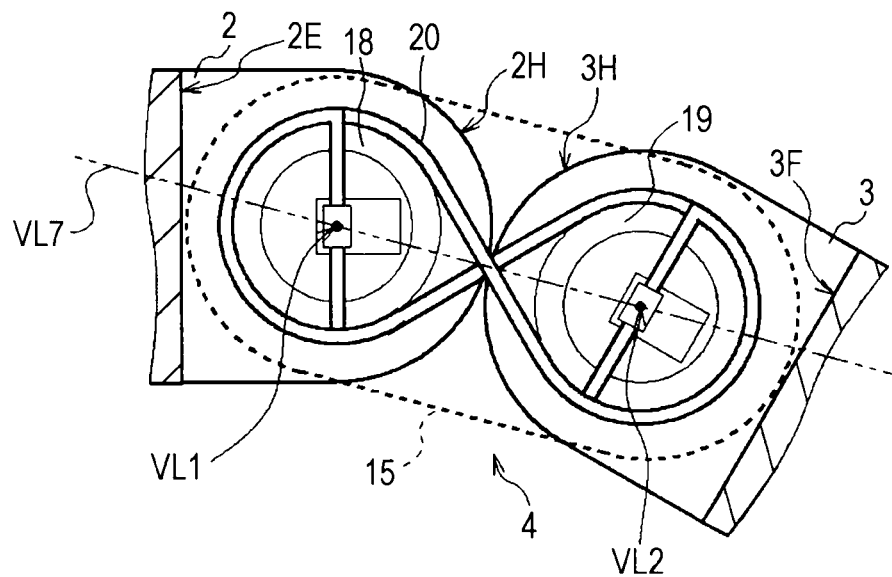
FIGS. 17A and 17B are diagrammatic diagrams for explanation of changes (4) in the positions of the first hinge section and the second hinge section at the time of opening and closing of the first casing and the second casing.
Figure 17B:
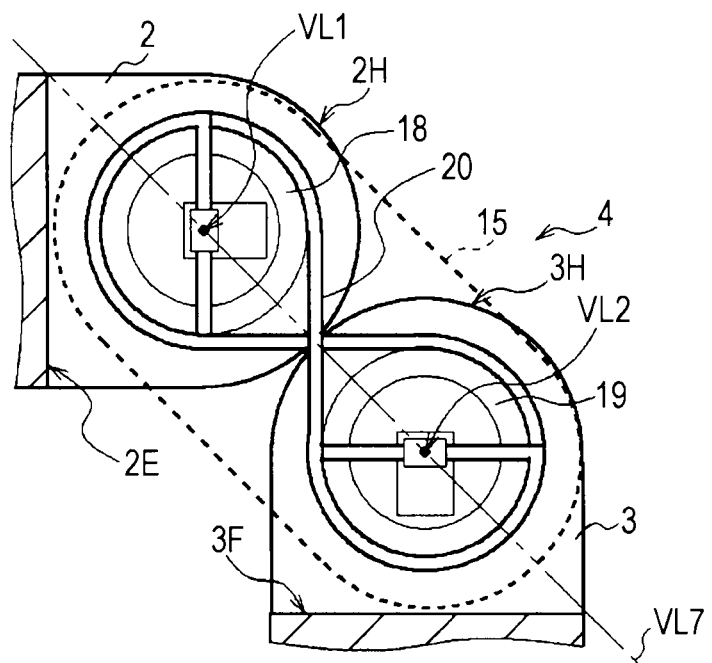
Figure 18A:
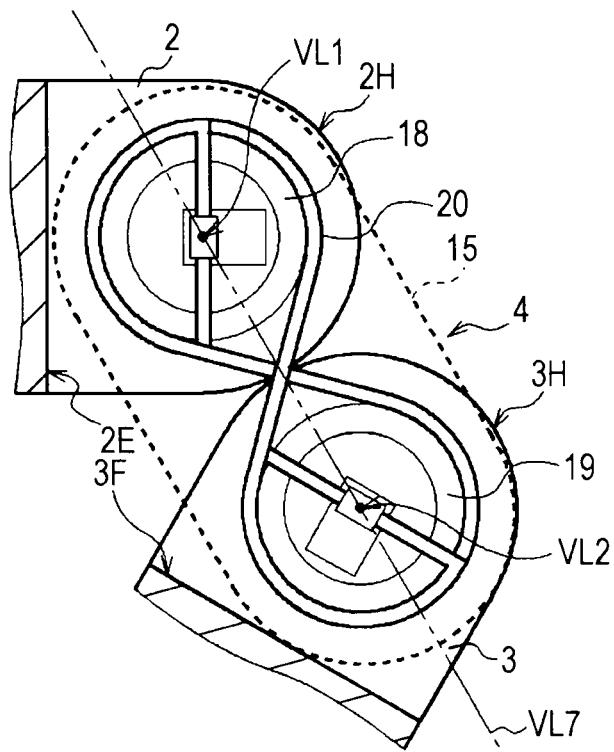
FIGS. 18A and 18B are diagrammatic diagrams for explanation of changes (5) in the positions of the first hinge section and the second hinge section at the time of opening and closing of the first casing and the second casing.
Figure 18B:
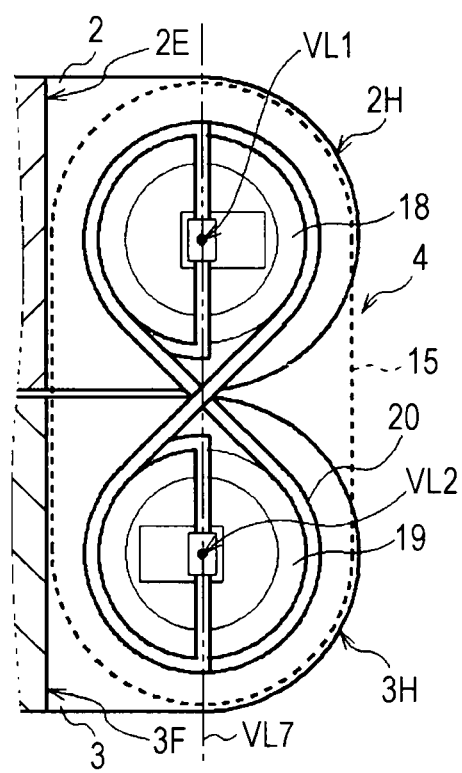
Figure 19A:
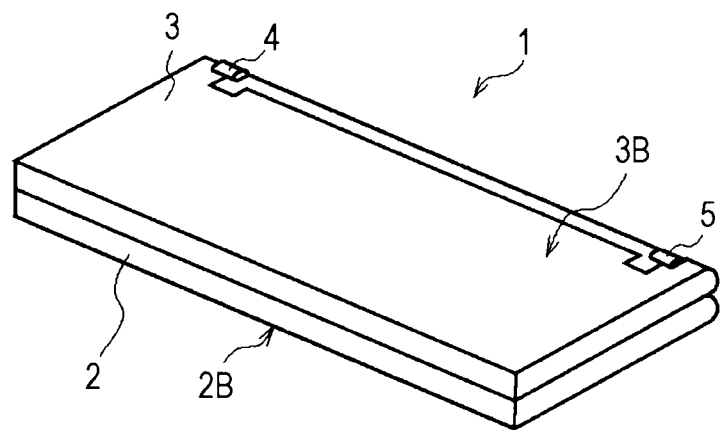
FIGS. 19A and 19B are diagrammatic perspective views for explanation of opening and closing (1) of the first casing and the second casing.
Figure 19B:
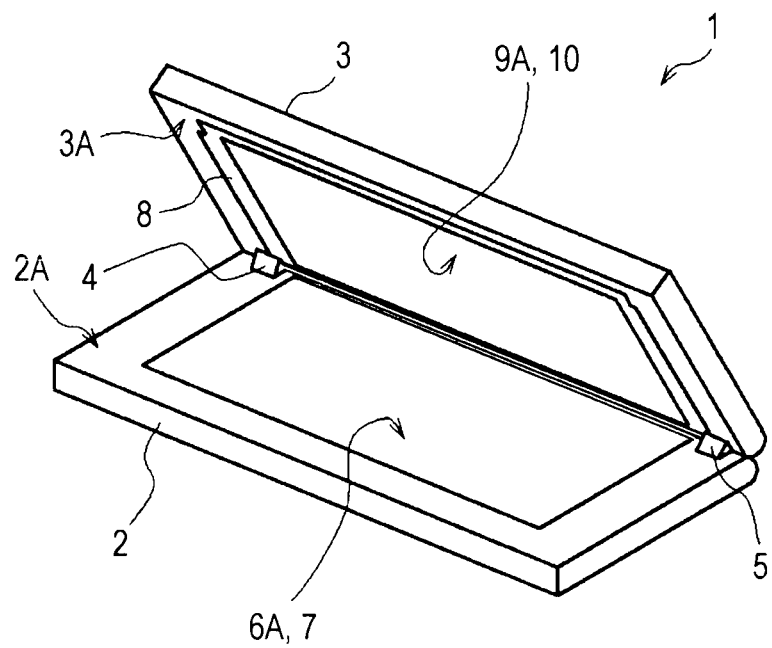
Figure 20A:
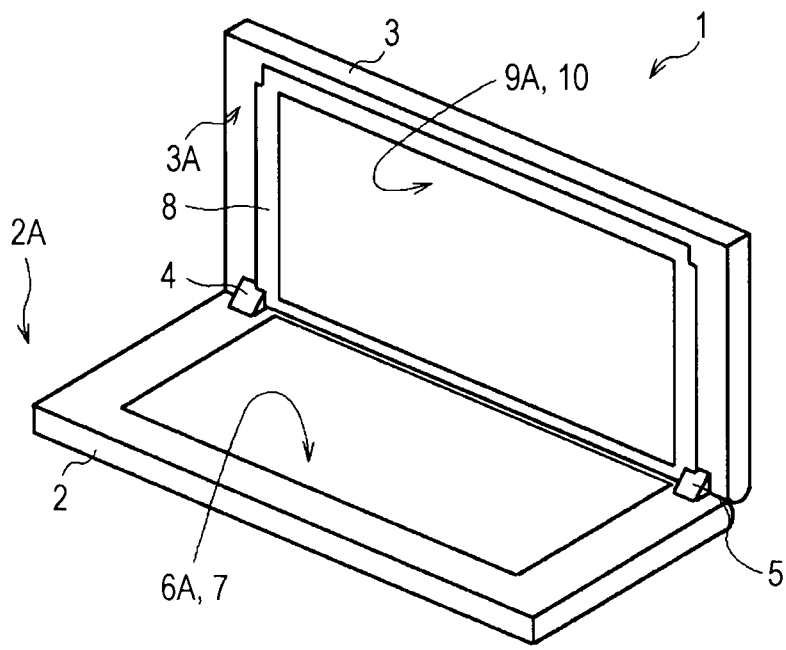
FIGS. 20A and 20B are diagrammatic perspective views for explanation of opening and closing (2) of the first casing and the second casing.
Figure 20B:
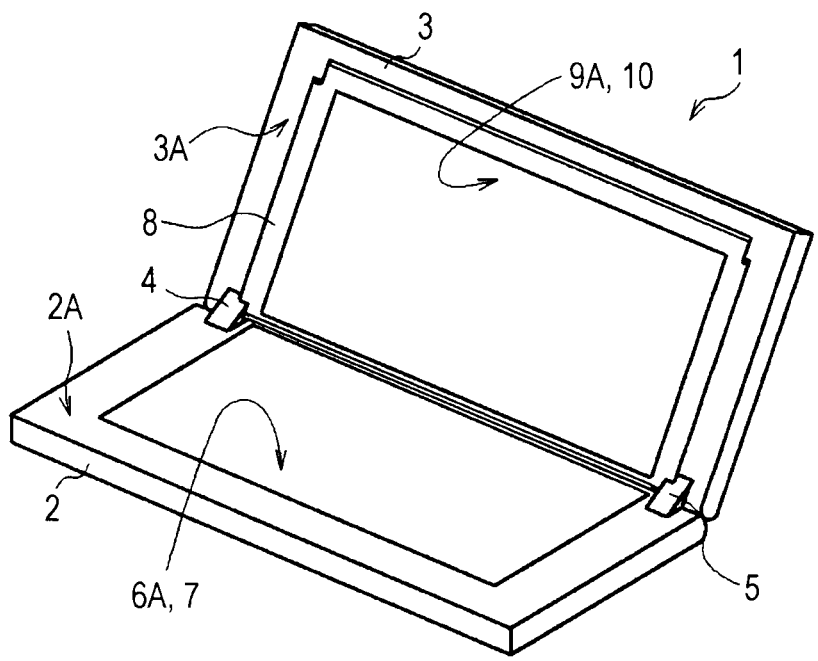
Figure 21A:
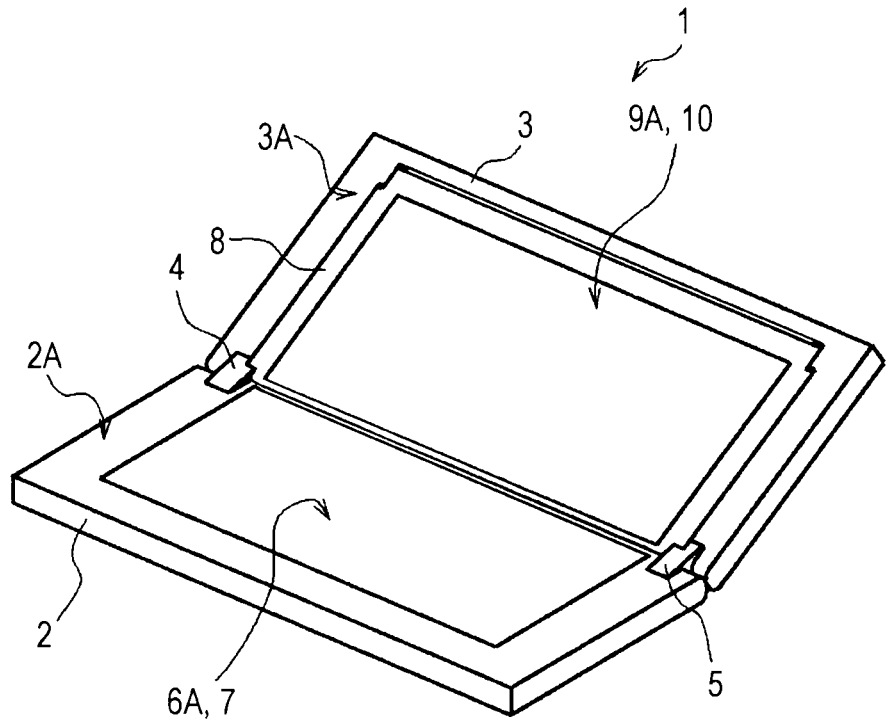
FIGS. 21A and 21B are diagrammatic perspective views for explanation of opening and closing (3) of the first casing and the second casing.
Figure 21B:
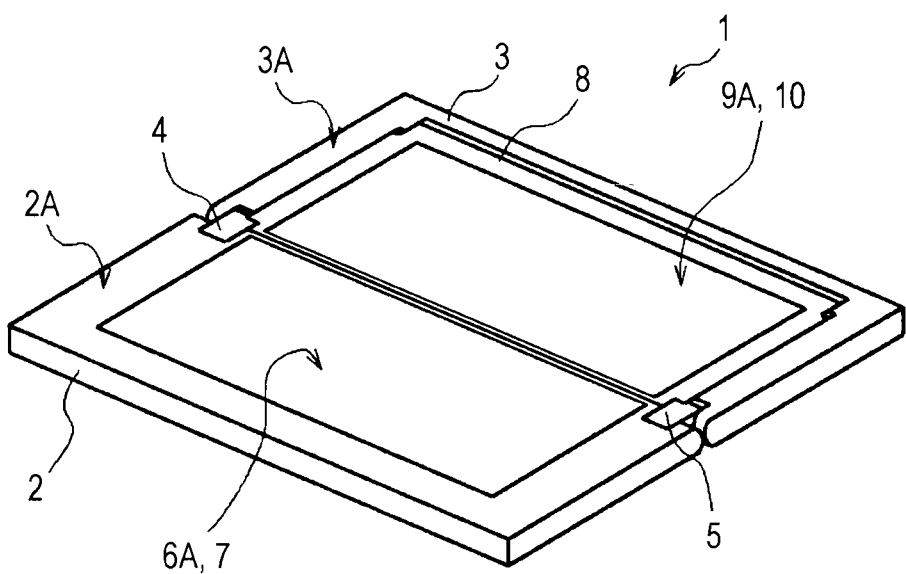
Figure 22A:
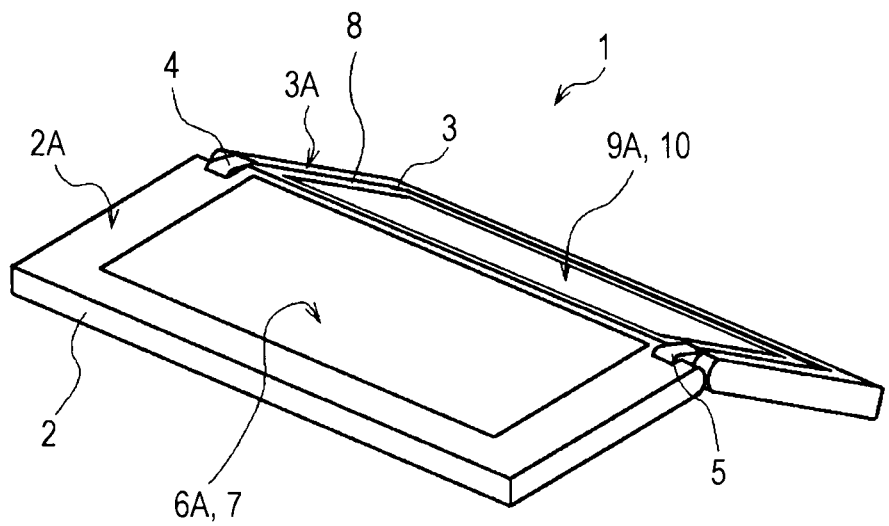
FIGS. 22A and 22B are diagrammatic perspective views for explanation of opening and closing (4) of the first casing and the second casing.
Figure 22B:
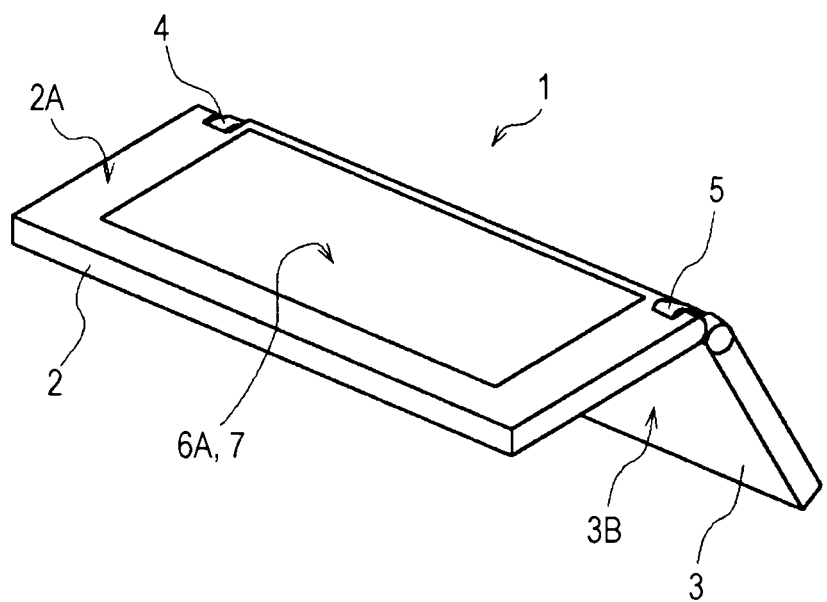

Then, as shown in FIGS. 11 to 13, the second hinge section 5 has two first and second cylindrical turning shafts 26 and 27 each having a radius approximately equal to that of the above-mentioned one end-side hole portion 15CX. Further, the second hinge section 5 also has two first and second disc-shaped pulleys 28 and 29 housed in the second hinge case 25.

Incidentally, FIG. 11 shows a spread state of the first casing 2 and the second casing 3, and FIGS. 12 and 13 show a state where the first casing 2 and the second casing 3 are opened at an angle of about 120 degrees.

In the second hinge case 25, the first turning shaft 26 is inserted into the one end-side hole portion 25DX of the second hinge case 25 so as to be able to turn around the virtual line VL5.

Then, one end protruding to the outside of the second hinge case 25 in the first turning shaft 26 is fixed to an inner wall of the first right shaft formation portion 2J of the first casing 2 in a state where the virtual line VL5 which becomes the center of turning of the first turning shaft 26 corresponds with the virtual line VL1.

Further, the other end entered into the second hinge case 25 in the first turning shaft 26 is fixed to a central portion of one face of the first pulley 28 in a state where the virtual line VL5 corresponds with the central axis of the first pulley 28.

Further, in the second hinge case 25, the second turning shaft 27 is inserted into the other end-side hole portion 25DY of the second hinge case 25 in parallel with the first turning shaft 26 so as to be able to turn around the virtual line VL6.

One end protruding to the outside of the second hinge case 25 in the second turning shaft 27 is fixed to an inner wall of the second right shaft formation portion 3J of the second casing 3 in a state where the virtual line VL6 which becomes the center of turning of the second turning shaft 27 corresponds with the virtual line VL2.

Further, the other end entered into the second hinge case 25 in the second turning shaft 27 is fixed to a central portion of one face of the second pulley 29 in a state where the virtual line VL6 corresponds with the central axis of the second pulley 29.

In this way, in the second hinge section 5, at the time of opening and closing of the first casing 2 and the second casing 3, in conjunction with the opening and closing, the first pulley 28 turns along with the first turning shaft 26 in the second hinge case 25 and the second pulley 29 also turns along with the second turning shaft 27.

Further, in the second hinge section 5, a wire 30 is wound in a figure of eight from a side face of the first pulley 28 to a side face of the second pulley 29. Further, one portion of the wire 30 is led and fixed to the other face of the first pulley 28 and the other portion is led and fixed to the other face of the second pulley 29.

Incidentally, at the time of assembly of the electronic apparatus 1, the wire 30 is wound around and fixed to the first pulley 28 and the second pulley 29, for example, in a state where the first casing 2 and the second casing 3 are opened at an angle of 180 degrees, whereby an end face of the first right shaft formation portion 2J and an end face of the second right shaft formation portion 3J come into contact with each other.

In this way, in the second hinge section 5, at the time of opening and closing of the first casing 2 and the second casing 3, the first pulley 28 and the second pulley 29 turn relative to each other in the opposite directions in synchronization with each other without sliding of the wire 30 on the side faces of the first and second pulleys 28 and 29.

That is, in the second hinge section 5, similarly to the case of the above-mentioned first hinge section 4, at the time of opening and closing of the first casing 2 and the second casing 3, turning only of the second turning shaft 27 and the second pulley 29 with respect to the first turning shaft 26 and the first pulley 28 is prevented.

Further, in the second hinge section 5, at the time of opening and closing of the first casing 2 and the second casing 3, turning only of the first turning shaft 26 and the first pulley 28 with respect to the second turning shaft 27 and the second pulley 29 is also prevented.

In this way, the second hinge section 5 connects the right side of the first casing one end portion of the first casing 2 and the right side of the second casing one end portion of the second casing 3, thereby allowing the first casing 2 and the second casing 3 to be opened and closed.

In fact, as shown in FIGS. 14A to 18B, in the first casing 2, each of the end face of the first left shaft formation portion 2H and the end face of the first right shaft formation portion 2J is formed into an arc shape so as to describe a semicircle, as described above.

Further, in the second casing 3, each of the end face of the second left shaft formation portion 3H and the end face of the second right shaft formation portion 3J is formed into an arc shape so as to describe a semicircle, as described above.

Then, in the first hinge section 4, as described above, at the time of assembly of the electronic apparatus 1, the wire 20 is wound around and fixed to the first and second pulleys 18 and 19 in a state where the end face of the first left shaft formation portion 2H and the end face of the second left shaft formation portion 3H come into contact with each other.

Further, in the second hinge section 5, as described above, at the time of assembly of the electronic apparatus 1, the wire 30 is wound around and fixed to the first and second pulleys 28 and 29 in a state where the end face of the first right shaft formation portion 2J and the end face of the second right shaft formation portion 3J come into contact with each other.

Further, in the first casing 2, the left and right sides of the first casing one end portion are formed plane-symmetrically and also in the second casing 3, the left and right sides of the second casing one end portion are formed plane-symmetrically. Further, the first hinge section 4 and the second hinge section 5 are also formed plane-symmetrically.

Accordingly, if the first casing 2 and the second casing 3 are operated for opening or closing from the outside at the time of use of the electronic apparatus 1, the first hinge section 4 and the second hinge section 5 change positions in synchronization with each other in a state where the first left shaft formation portion 2H and the second left shaft formation portion 3H come into contact with each other and the first right shaft formation portion 2J and the second right shaft formation portion 3J also come into contact with each other.

In this way, the first hinge section 4 and the second hinge section 5 allow the first casing 2 and the second casing 3 to be freely opened or closed in a range from an angle of 0 degrees to an angle of 360 degrees.

That is, at the time of use of the electronic apparatus 1, the first hinge section 4 and the second hinge section 5 allow the first casing 2 and the second casing 3 to be freely opened or closed without any catching of the first casing one end portion on the second casing one end portion.

Further, in the first hinge section 4, the wire 20 which is wound over the first pulley 18 and the second pulley 19 intersects between the first pulley 18 and the second pulley 19 in a state where it is away from these pulleys.

Then, in a case where the first casing 2 and the second casing 3 are opened or closed, the first hinge section 4 displaces an intersection portion of the wires 20 between the first pulley 18 and the second pulley 19 without sliding of the wire 20 with respect to the first pulley 18 and the second pulley 19.

Further, also in the second hinge section 5, the wire 30 which is wound over the first pulley 28 and the second pulley 29 intersects between the first pulley 28 and the second pulley 29 in a state where it is away from these pulleys.

Then, in a case where the first casing 2 and the second casing 3 are opened or closed, the second hinge section 5 displaces an intersection portion of the wires 30 between the first pulley 28 and the second pulley 29 without sliding of the wire 30 with respect to the first pulley 28 and the second pulley 29.

In this way, at the time of opening or closing of the first casing 2 and the second casing 3, the first hinge section 4 and the second hinge section 5 can relatively turn the first casing 2 and the second casing 3 in the opposite directions in synchronization with each other around the first turning shafts 16 and 26 and the second turning shafts 17 and 27.

That is, the first hinge section 4 and the second hinge section 5 prevent occurrence of a step in a connection portion of the first casing 2 and the second casing 3 due to turning of either one only, thereby allowing the first casing 2 and the second casing 3 to be opened or closed as if they were connected to each other by one shaft.

Then, in the first hinge section 4, the first turning shaft 16 and the second turning shaft 17 respectively turn in the one end-side hole portion 15CX and the other end-side hole portion 15CY of the first hinge case 15.

Further, in the first hinge section 4, as described above, the first hinge length is selected so as to be approximately equal to a length of two times the casing thickness and also the first hinge thickness is selected so as to be approximately equal to the casing thickness.

Accordingly, at the time of opening or closing of the first casing 2 and the second casing 3, the first hinge section 4 changes a position in a state where the first hinge section longitudinal direction is in parallel with a virtual line VL7 orthogonal to the two virtual lines VL1 and VL2, in the first casing left cutout portion 2E and the second casing left cutout portion 3F.

Further, also in the second hinge section 5, the first turning shaft 26 and the second turning shaft 27 respectively turn in the one end-side hole portion 25DX and the other end-side hole portion 25DY of the second hinge case 25.

Further, also in the second hinge section 5, as described above, the second hinge length is selected so as to be approximately equal to a length of two times the casing thickness and also the second hinge thickness is selected so as to be approximately equal to the casing thickness.

Accordingly, at the time of opening or closing of the first casing 2 and the second casing 3, the second hinge section 5 also changes a position in a state where the second hinge section longitudinal direction is in parallel with the virtual line VL7 orthogonal to the two virtual lines VL1 and VL2, in the first casing right cutout portion 2F and the second casing right cutout portion 3G.

Especially, the first hinge section 4 and the second hinge section 5 avoid protrusion of the first casing one end portion and the second casing one end portion or the first casing other end portion and the second casing other end portion from the first casing other face 2B or the second casing other face 3B in the folded state (FIG. 14A) of the first casing 2 and the second casing 3.

Further, also in the back-to-back state (FIG. 18B) of the first casing 2 and the second casing 3, the first hinge section 4 and the second hinge section 5 avoid protrusion of the first casing one end portion and the second casing one end portion or the first casing other end portion and the second casing other end portion from the first casing one face 2A or the second casing one face 3A.

That is, in the folded state or the back-to-back state of the first casing 2 and the second casing 3, the first hinge section 4 and the second hinge section 5 are integrated with the first casing 2 and the second casing 3 so as to form a single rectangular parallelepiped having a thickness of two times the casing thickness along with the first and second casings 2 and 3 which are superposed.

In addition, the first hinge section 4 and the second hinge section 5 avoid protrusion of the first hinge one face 15A and the second hinge one face 25A from the first casing one face 2A and the second casing one face 3A in the spread state (FIG. 16B) of the first casing 2 and the second casing 3.

Further, the first hinge section 4 and the second hinge section 5 also avoid protrusion of the first hinge other face 15B and the second hinge other face 25B from the first casing other face 2B and the second casing other face 3B in the spread state (FIG. 16B) of the first casing 2 and the second casing 3.

That is, in the spread state of the first casing 2 and the second casing 3, the first hinge section 4 and the second hinge section 5 are integrated with the first casing 2 and the second casing 3 so as to form a single rectangular parallelepiped having the casing thickness along with the first and second casings 2 and 3 which are lined up.

Figure 23A:
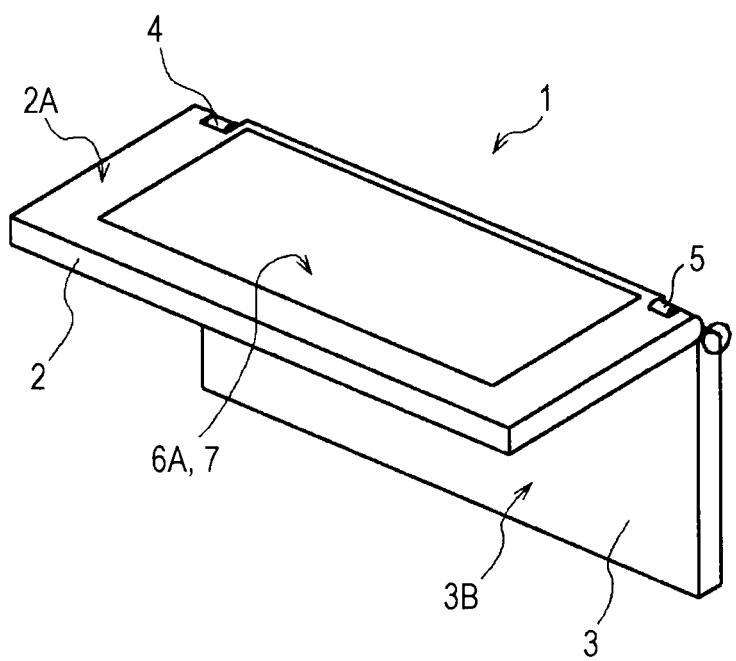
FIGS. 23A and 23B are diagrammatic perspective views for explanation of opening and closing (5) of the first casing and the second casing.
Figure 23B:
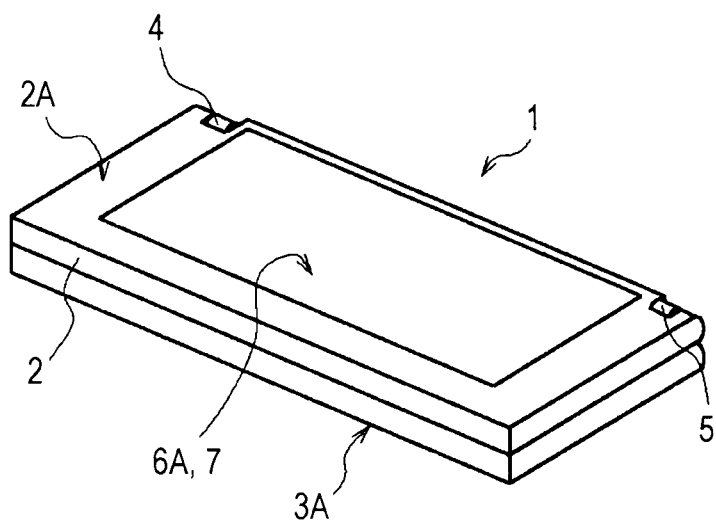

In this way, as shown in FIGS. 19A to 23B, in the electronic apparatus 1, the first casing 2 and the second casing 3 can be freely opened and closed in a range from 0 degrees (the folded state shown in FIG. 19A) to 360 degrees (the back-to-back state shown in FIG. 23B).

Incidentally, in the second casing 3, one or a plurality of springs (a coil spring, a leaf spring, or the like) is provided at the second casing other end side in the cutout portion for displacement 3E. In this way, in the second casing 3, the second display section 9 is biased along with the holding section 8 to the second casing one end side by the spring in the cutout portion for displacement 3E.

Figure 24A:
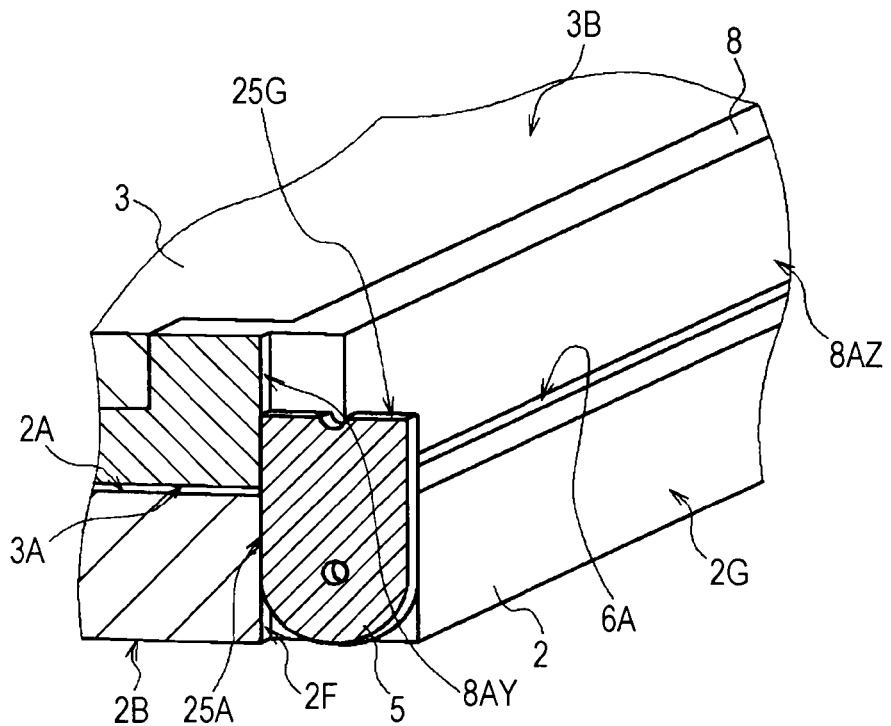
FIGS. 24A and 24B are diagrammatic perspective views for explanation of displacement (1) of a second display section according to opening and closing of the first casing and the second casing.
Figure 24B:
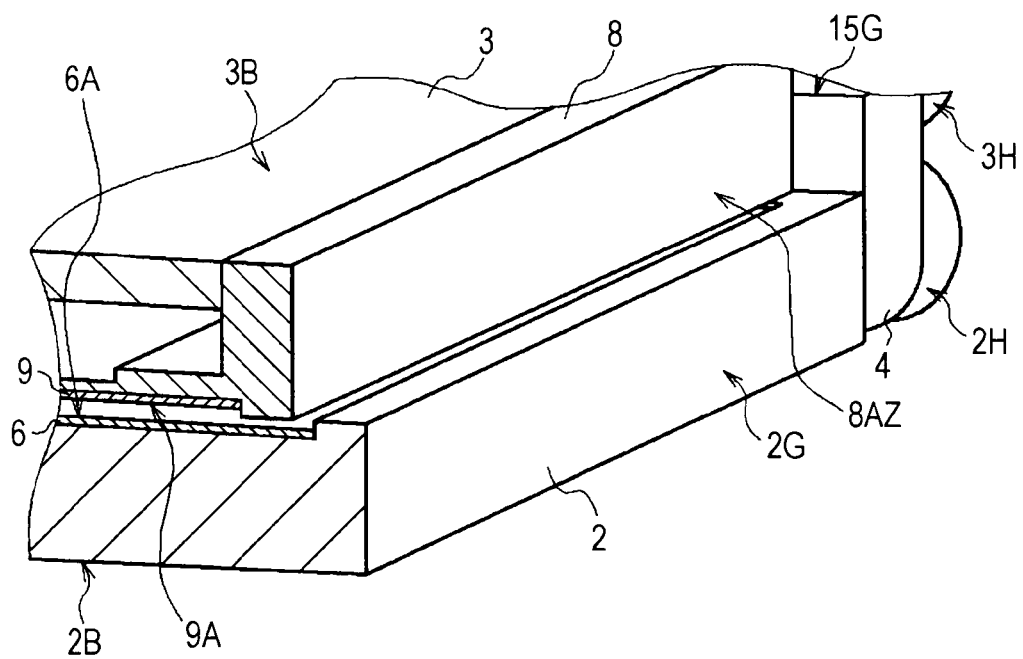
Figure 25A:
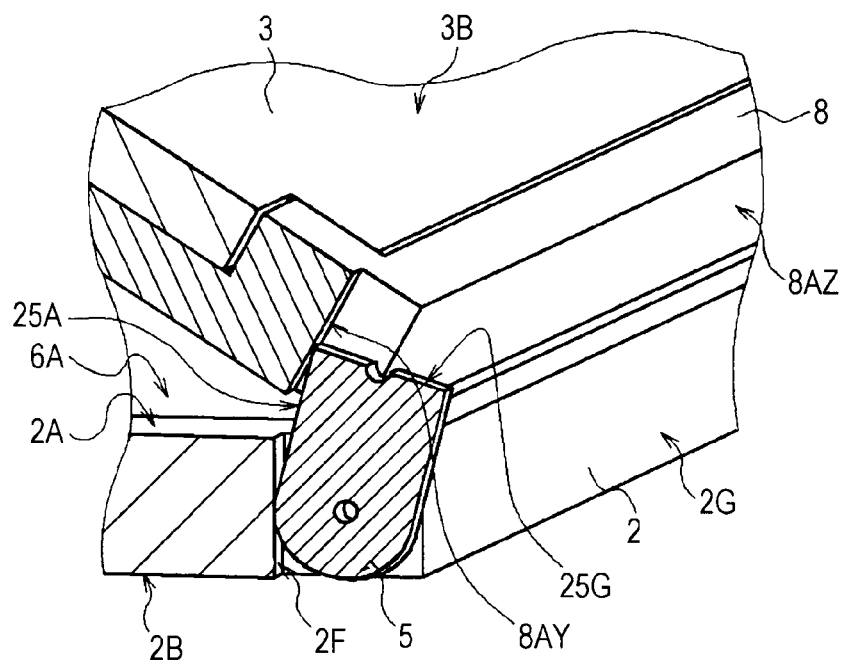
FIGS. 25A and 25B are diagrammatic perspective views for explanation of displacement (2) of the second display section according to opening and closing of the first casing and the second casing.
Figure 25B:
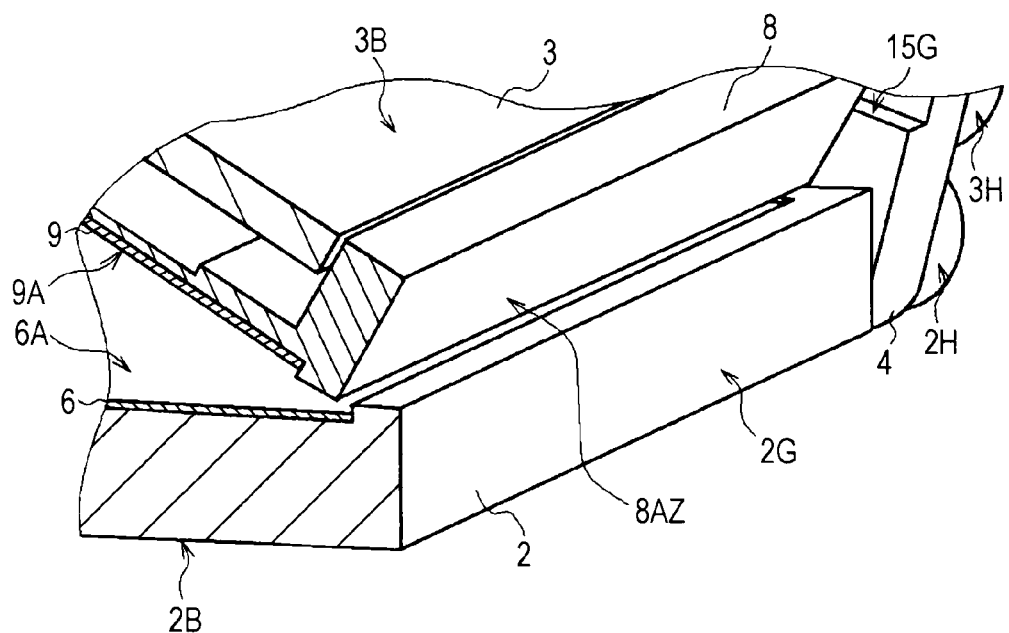
Figure 26A:
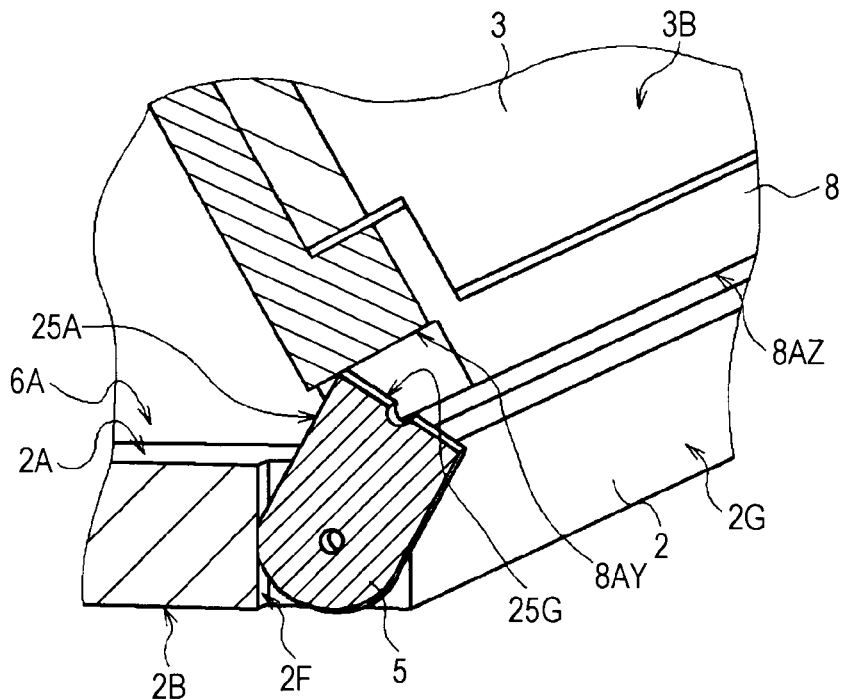
FIGS. 26A and 26B are diagrammatic perspective views for explanation of displacement (3) of the second display section according to opening and closing of the first casing and the second casing.
Figure 26B:
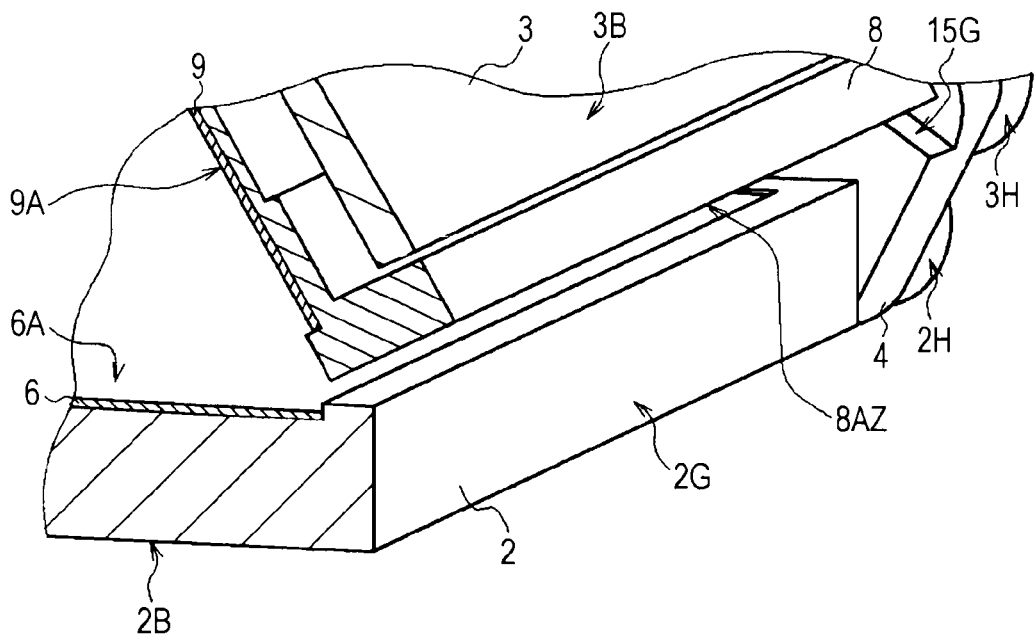
Figure 27A:
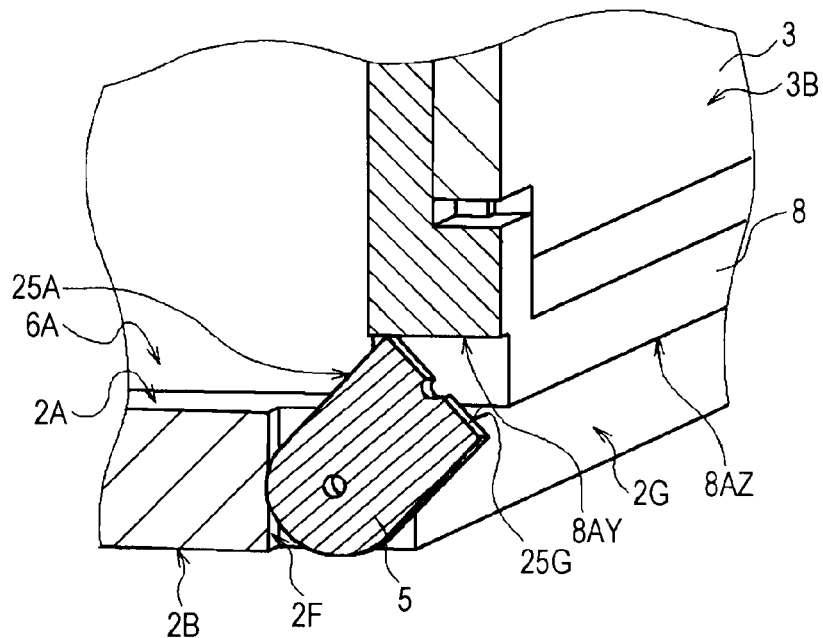
FIGS. 27A and 27B are diagrammatic perspective views for explanation of displacement (4) of the second display section according to opening and closing of the first casing and the second casing.
Figure 27B:
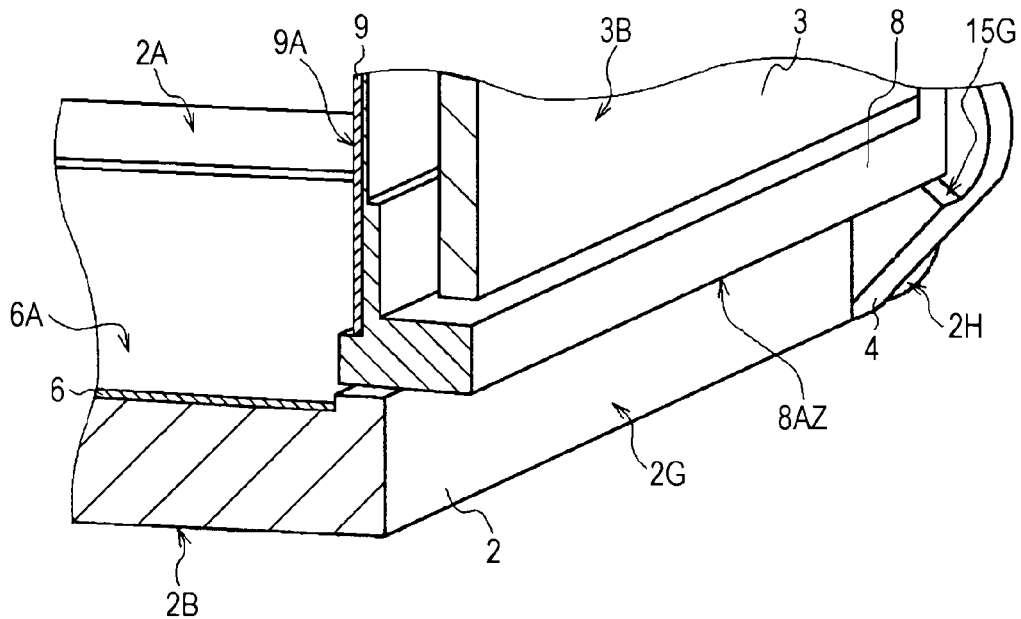
Figure 28A:
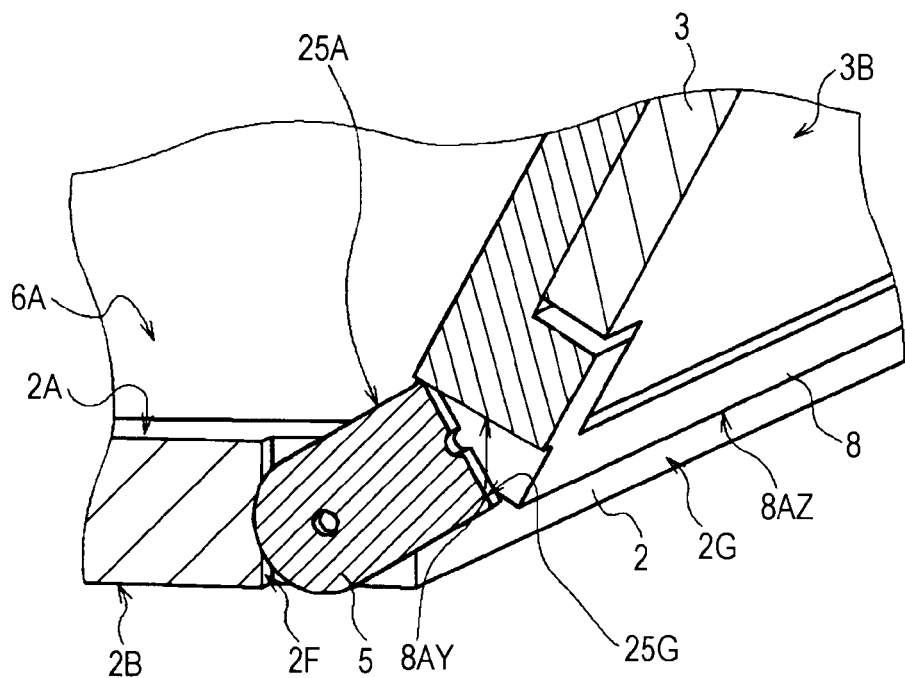
FIGS. 28A and 28B are diagrammatic perspective views for explanation of displacement (5) of the second display section according to opening and closing of the first casing and the second casing.
Figure 28B:
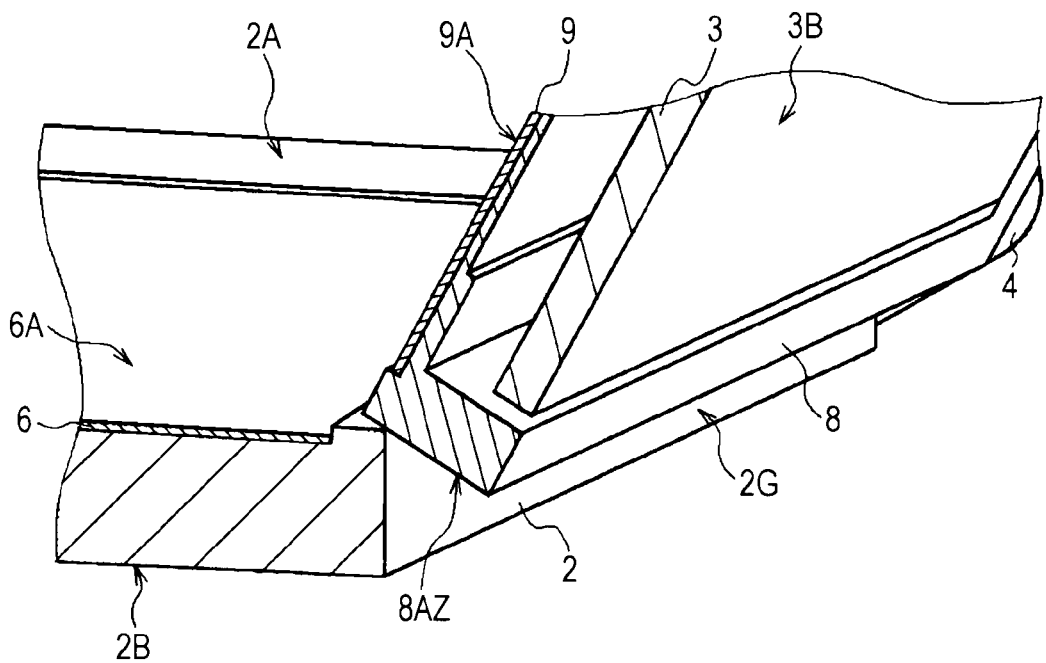
Figure 29A:
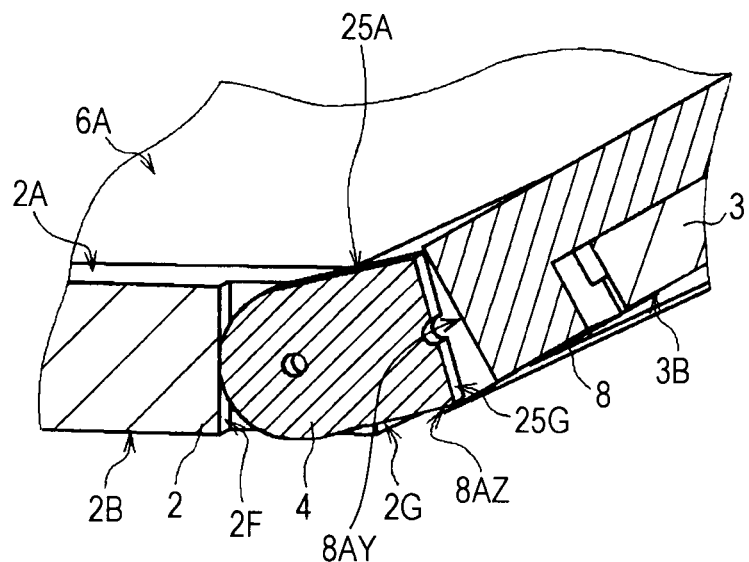
FIGS. 29A and 29B are diagrammatic perspective views for explanation of displacement (6) of the second display section according to opening and closing of the first casing and the second casing.
Figure 29B:
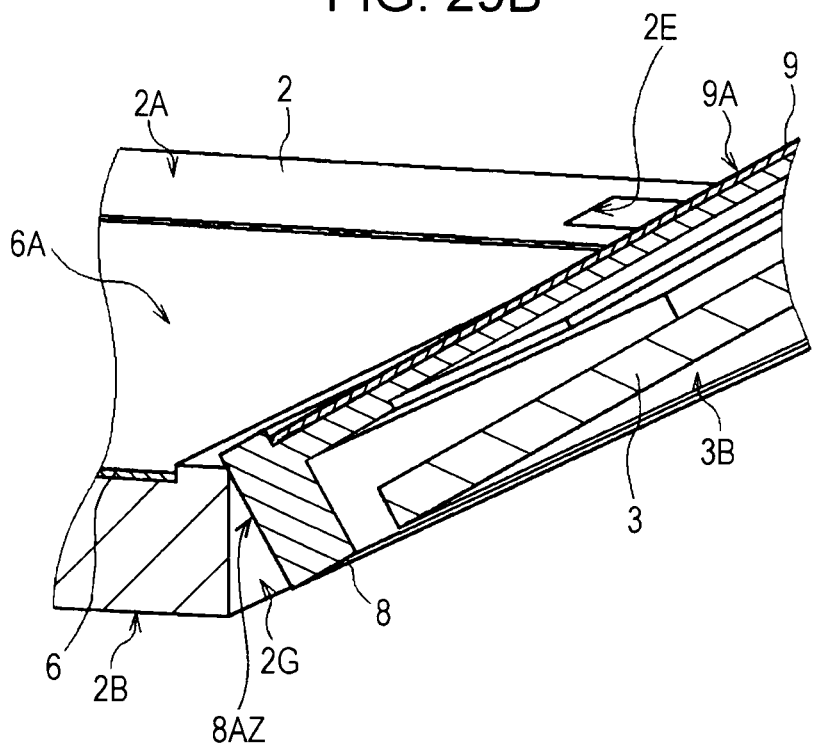

Then, as shown in FIGS. 24A and 24B, in a case where the first casing 2 and the second casing 3 have been closed at an angle of 0 degrees (the case of the folded state), the first hinge section 4 makes the portion near the first hinge right side face 15D of the first hinge one face 15A strike the bottom face of the left cutout portion 8AX of the holding section 8.

Further, at this time, the second hinge section 5 makes the portion near the second hinge left side face 25C of the second hinge one face 25A strike the bottom face of the right cutout portion 8AY of the holding section 8.

In this way, the first hinge section 4 and the second hinge section 5 align the positions of the bottom faces of the left cutout portion 8AX and the right cutout portion 8AY with the positions of the bottom faces of the second casing left cutout portion 3F and the second casing right cutout portion 3G of the second casing 3 and displace the second display section 9 along with the holding section 8 to the second casing other end side.

That is, in the holding section 8, as described above, the depth from the holding section one end face 8AZ to the bottom face of each of the left cutout portion 8AX and the right cutout portion 8AY is selected so as to be about ½ of the casing thickness.

Further, in the first casing 2, as described above, the depth from the first casing one end face 2G of the first casing one end central portion to the bottom face of each of the first casing left cutout portion 2E and the first casing right cutout portion 2F is selected so as to be approximately equal to the casing thickness. Further, in the first hinge section 4 and the second hinge section 5, as described above, the first hinge thickness and the second hinge thickness are selected so as to be approximately equal to the casing thickness.

Then, in the folded state of the first casing 2 and the second casing 3, the first hinge longitudinal direction is made to be in parallel with the first casing thickness direction (and the second casing thickness direction), whereby the first hinge section 4 is located over an area from the inside of the first casing left cutout portion 2E of the first casing 2 to the inside of the second casing left cutout portion 3F of the second casing 3.

Accordingly, at this time, the first hinge section 4 makes the portion (that is, the portion near the first hinge right side face 15D from the center to an edge of the first cam end face 15GX) of the first cam portion 15G in the first hinge one face 15A strike the bottom face of the left cutout portion 8AX of the holding section 8.

Further, in the folded state of the first casing 2 and the second casing 3, the second hinge longitudinal direction is made to be in parallel with the first casing thickness direction (and the second casing thickness direction), whereby the second hinge section 5 is located over an area from the inside of the first casing right cutout portion 2F of the first casing 2 to the inside of the second casing right cutout portion 3G of the second casing 3.

Accordingly, at this time, in the second hinge section 5 makes the portion (that is, the portion near the second hinge left side face 25C from the center to an edge of the second cam end face 25GX) of the second cam portion 25G in the second hinge one face 25A strike the bottom face of the right cutout portion 8AY of the holding section 8.

In this way, the first hinge section 4 and the second hinge section 5 displace the second display section 9 along with the holding section 8 to the second casing other end side in the cutout portion for displacement 3E so as to make the holding section one end face 8AZ of the holding section 8 be located at the second casing other end side by a distance of ½ of the casing thickness.

That is, in the folded state of the first casing 2 and the second casing 3, while the first casing one end face 2G and the holding section one end face 8AZ are formed into a planar shape, the first hinge section 4 and the second hinge section 5 make the first casing one end face 2G and the holding section one end face 8AZ be located away from each other.

Accordingly, the first hinge section 4 and the second hinge section 5 allow the first casing 2 and the second casing 3 to be opened from the folded state without any catching of an edge of the first casing one end face 2G on an edge of the holding section one end face 8AZ.

As shown in FIGS. 25A to 29B, if the first casing 2 and the second casing 3 actually start to be opened from the folded state, the first hinge section 4 changes a position such that the first hinge section longitudinal direction gradually tilts with respect to the first casing thickness direction.

Accordingly, the first hinge section 4 makes the portion (the central portion near the first hinge right side face 15D) of the first cam portion 15G in the first hinge one face 15A be gradually separated from the bottom face of the left cutout portion 8AX of the holding section 8, thereby making an edge of the first cam end face 15GX strike the bottom face of the left cutout portion 8AX.

Then, the first hinge section 4 changes the contact position of an edge of the first cam end face 15GX with respect to the bottom face of the left cutout portion 8AX of the holding section 8 from the center of the bottom face to the second casing one face 3A side while changing a position in accordance with an increase in an open angle of the first casing 2 and the second casing 3.

Further, at this time, the second hinge section 5 changes a position such that the second hinge section longitudinal direction gradually tilts with respect to the first casing thickness direction. Accordingly, the second hinge section 5 makes the portion (the central portion near the second hinge left side face 25C) of the second cam portion 25G in the second hinge one face 25A be gradually separated from the bottom face of the right cutout portion 8AY of the holding section 8, thereby making an edge of the second cam end face 25GX strike the bottom face of the right cutout portion 8AY.

Then, the second hinge section 5 changes the contact position of an edge of the second cam end face 25GX with respect to the bottom face of the right cutout portion 8AY of the holding section 8 from the center of the bottom face to the second casing one face 3A side while changing a position in accordance with an increase in an open angle of the first casing 2 and the second casing 3.

In this way, the larger the open angle of the first casing 2 and the second casing 3 become, the more the first hinge section 4 and the second hinge section 5 displace the second display section 9 along with the holding section 8 to the second casing one end side in the cutout portion for displacement 3E, thereby bringing the holding section one end face 8AZ close to the first casing one face 2A.

Then, when the first casing 2 and the second casing 3 have been opened, for example, at an angle of 90 degrees (FIGS. 27A and 27B), the first hinge section 4 and the second hinge section 5 make the holding section one end face 8AZ of the holding section 8 be in a state where it is slightly away from a position near the first casing one end of the first casing one face 2A.

However, if the open angle of the first casing 2 and the second casing 3 becomes larger than, for example, an angle of 120 degrees (FIGS. 28A and 29B), the first hinge section 4 and the second hinge section 5 make the holding section one end face 8AZ strike a corner portion between the first casing one face 2A and the first casing one end face 2G.

That is, while the first casing 2 and the second casing 3 are further opened beyond 120 degrees, the holding section 8 is in a state where it is slightly away from the first cam end face 15GX and the second cam end face 25GX.

At this time, the holding section 8 is further displaced along with the second display section 9 to the second casing one end side while changing the contact position of the holding section one end face 8AZ with respect to an edge near the first casing one end of the first casing one face 2A to the second casing one face 3A side.

Figure 30A:
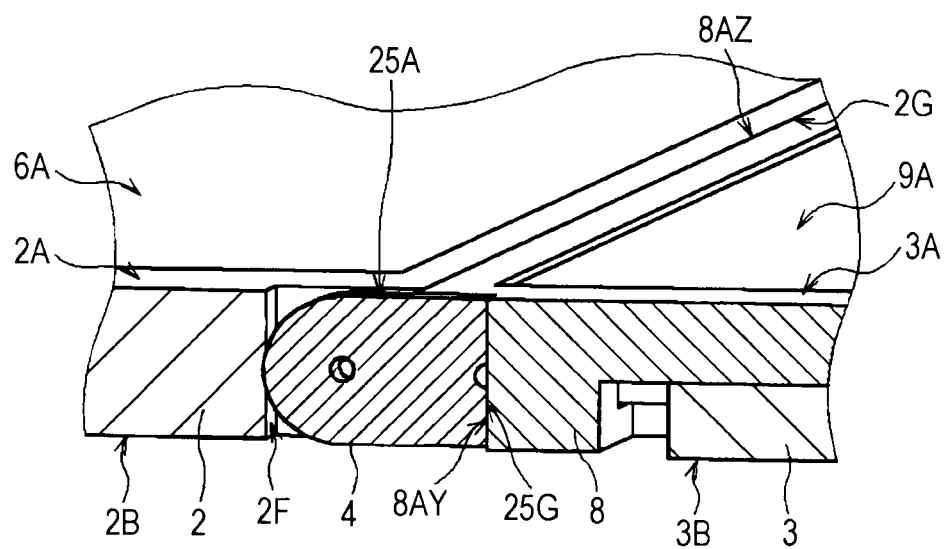
FIGS. 30A and 30B are diagrammatic perspective views for explanation of displacement (7) of the second display section according to opening and closing of the first casing and the second casing.
Figure 30B:
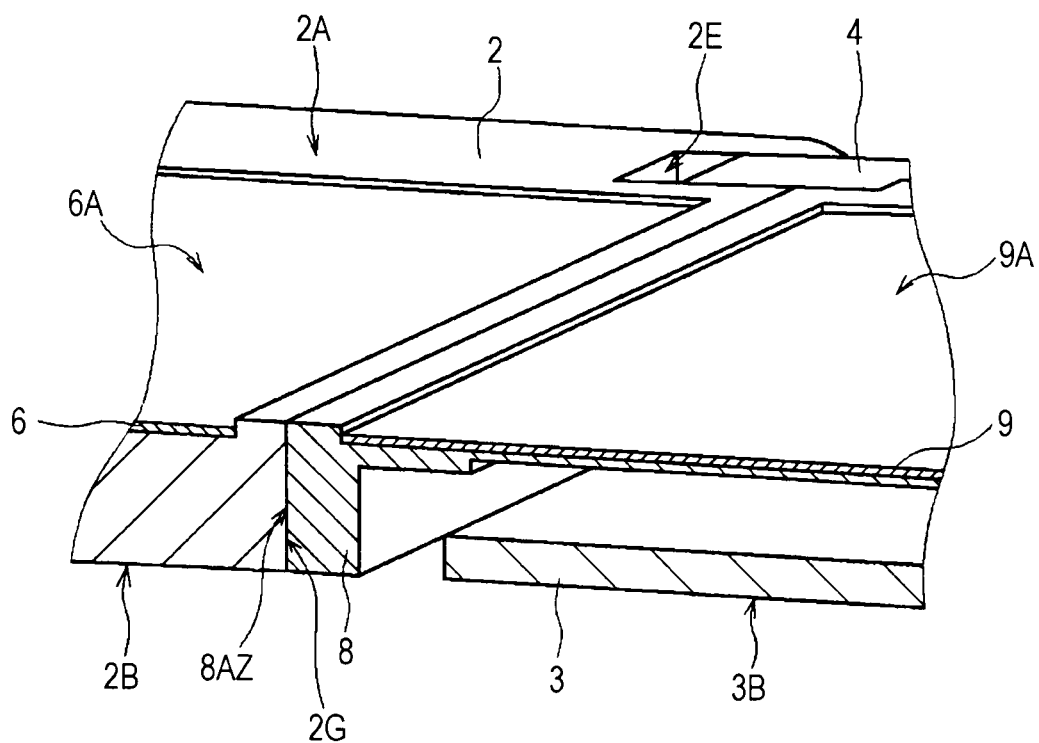

Then, as shown in FIGS. 30A and 30B, in the spread state of the first casing 2 and the second casing 3, the first hinge section 4 changes a position such that the first hinge section longitudinal direction is in parallel with the first casing depth direction and the second casing depth direction.

Accordingly, at this time, the first hinge section 4 is located over an area from the inside of the first casing left cutout portion 2E of the first casing 2 to the inside of the second casing left cutout portion 3F of the second casing 3, thereby making the first cam end face 15GX strike the bottom face of the left cutout portion 8AX of the holding section 8.

Further, in the spread state of the first casing 2 and the second casing 3, the second hinge section 5 changes a position such that the second hinge section longitudinal direction is in parallel with the first casing depth direction and the second casing depth direction.

Accordingly, at this time, the second hinge section 5 is located over an area from the inside of the first casing right cutout portion 2F of the first casing 2 to the inside of the second casing right cutout portion 3G of the second casing 3, thereby making the second cam end face 25GX strike the bottom face of the right cutout portion 8AY of the holding section 8.

In this way, the first hinge section 4 and the second hinge section 5 displace the second display section 9 along with the holding section 8 to the second casing other end side to the fullest extent in the cutout portion for displacement 3E, thereby making the holding section one end face 8AZ of the holding section 8 strike the first casing one end face 2G of the first casing one end central portion.

That is, if the first casing one face 2A and the second casing one face 3A line up in the spread state of the first casing 2 and the second casing 3, the first hinge section 4 and the second hinge section 5 bring the second display surface 9A close to the first display surface 6A.

Therefore, in this manner, in the spread state (FIG. 21B) of the first casing 2 and the second casing 3, the first hinge section 4 and the second hinge section 5 can arrange the first display surface 6A of the first display section 6 and the second display surface 9A of the second display section 9 as if they were a single display surface.

Then, at this time, the holding section 8 makes the planar holding section one end face 8AZ strike the planar first casing one end face 2G of the first casing 2 in a state where the holding section 8 is biased to the second casing one end side.

Further, the first hinge section 4 and the second hinge section 5 make the planar first cam end face 15GX strike the planar bottom face of the left cutout portion 8AX of the holding section 8 and also make the planar second cam end face 25GX strike the planar bottom face of the right cutout portion 8AY of the holding section 8, as described above.

In this way, the first hinge section 4 and the second hinge section 5 lock (fix) the first casing 2 and the second casing 3 in the spread state. Accordingly, the first hinge section 4 and the second hinge section 5 can keep the spread state such that the open angle of the first casing 2 and the second casing 3 does not easily change even if the first casing 2 and the second casing 3 are lifted up, for example, in the spread state.

Further, if the first casing 2 and the second casing 3 are further opened from the spread state, the holding section one end face 8AZ is placed on a corner portion between the first casing other face 2B and the first casing one end face 2G, so that the holding section 8 enters a state where it is away from the first cam end face 15GX and the second cam end face 25GX.

Then, at this time, the holding section 8 is displaced again along with the second display section 9 to the second casing other end side in the cutout portion for displacement 3E while changing the contact position of the holding section one end face 8AZ with respect to the corner portion between the first casing other face 2B and the first casing one end face 2G to the second casing one face 3A side.

At this time, the first hinge section 4 and the second hinge section 5 change positions such that the first hinge section longitudinal direction and the second hinge section longitudinal direction gradually tilt with respect to the first casing depth direction, thereby being brought close to the first casing thickness direction.

As a result, if the first casing 2 and the second casing 3 are opened up to, for example, 240 degrees, the first hinge section 4 makes an edge of the first cam end face 15GX in the first hinge other face 15B strike a portion near the second casing other face 3B in the bottom face of the left cutout portion 8AX of the holding section 8.

Then, the first hinge section 4 changes a position in accordance with an increase in an open angle of the first casing 2 and the second casing 3. Accordingly, the first hinge section 4 changes the contact position of an edge of the first cam end face 15GX with respect to the bottom face of the left cutout portion 8AX of the holding section 8 from the second casing other face 3B side in the bottom face of the left cutout portion 8AX to the center side.

Further, if the second casing 3 is opened up to, for example, 240 degrees with respect to the first casing 2, the second hinge section 5 makes an edge of the second cam end face 25GX in the second hinge other face 25B strike a portion near the second casing other face 3B in the bottom face of the right cutout portion 8AY of the holding section 8.

Then, the second hinge section 5 also changes a position in accordance with an increase in an open angle of the first casing 2 and the second casing 3. Accordingly, the second hinge section 5 changes the contact position of an edge of the second cam end face 25GX with respect to the bottom face of the right cutout portion 8AY of the holding section 8 from the second casing other face 3B side in the bottom face of the right cutout portion 8AY to the center side.

In this way, when the first casing 2 and the second casing 3 have been opened at an angle of, for example, 270 degrees, the first hinge section 4 and the second hinge section 5 make the holding section one end face 8AZ of the holding section 8 be in a state where it is slightly away from a position near the first casing one end of the first casing other face 2B.

Then, if the first hinge section 4 further changes a position in accordance with an increase in an open angle of the first casing 2 and the second casing 3, the first hinge section 4 further changes the contact position of an edge of the first cam end face 15GX with respect to the bottom face of the left cutout portion 8AX of the holding section 8 to the center side of the bottom face.

Further, at this time, the second hinge section 5 further changes the contact position of an edge of the second cam end face 25GX with respect to the bottom face of the right cutout portion 8AY of the holding section 8 to the center side of the bottom face while further changing a position in accordance with an increase in an open angle of the first casing 2 and the second casing 3.

In this way, the larger the open angle of the first casing 2 and the second casing 3 becomes, the more the first hinge section 4 and the second hinge section 5 displace the second display section 9 along with the holding section 8 to the second casing other end side in the cutout portion for displacement 3E, thereby making the holding section one end face 8AZ be separated from the first casing other face 2B.

In this way, the first hinge section 4 gradually brings the portion (that is, the central portion near the first hinge right side face 15D) of the first cam portion 15G in the first hinge other face 15B close to the bottom face of the left cutout portion 8AX of the holding section 8 in accordance with an increase in an open angle of the first casing 2 and the second casing 3.

Further, the second hinge section 5 gradually brings the portion (that is, the central portion near the second hinge left side face 25C) of the second cam portion 25G in the second hinge other face 25B close to the bottom face of the right cutout portion 8AY of the holding section 8 in accordance with an increase in an open angle of the first casing 2 and the second casing 3.

Then, in the back-to-back state of the first casing 2 and the second casing 3, the first hinge section 4 makes the first hinge section longitudinal direction be in parallel with the first casing thickness direction (and the second casing thickness direction), thereby being located over an area from the inside of the first casing left cutout portion 2E of the first casing 2 to the inside of the second casing left cutout portion 3F of the second casing 3.

Accordingly, at this time, the first hinge section 4 makes the portion (that is, the portion from the center near the first hinge right side face 15D to an edge of the first cam end face 15GX) of the first cam portion 15G in the first hinge other face 15B strike the bottom face of the left cutout portion 8AX of the holding section 8.

Further, in the back-to-back state of the first casing 2 and the second casing 3, the second hinge section 5 makes the second hinge section longitudinal direction be in parallel with the first casing thickness direction (and the second casing thickness direction), thereby being located over an area from the inside of the first casing right cutout portion 2F of the first casing 2 to the inside of the second casing right cutout portion 3G of the second casing 3.

Accordingly, at this time, the second hinge section 5 makes the portion (that is, the portion from the center near the second hinge left side face 25C to an edge of the second cam end face 25GX) of the second cam portion 25G in the second hinge other face 25B strike the bottom face of the right cutout portion 8AY of the holding section 8.

In this way, the first hinge section 4 and the second hinge section 5 displace the second display section 9 along with the holding section 8 to the second casing other face side in the cutout portion for displacement 3E so as to make the holding section one end face 8AZ of the holding section 8 be located at the second casing other end side by a distance of ½ of the casing thickness.

That is, in the back-to-back state of the first casing 2 and the second casing 3, the first hinge section 4 and the second hinge section 5 make the first casing one end face 2G of a planar shape and the holding section one end face 8AZ of a planar shape be located away from each other.

Accordingly, the first hinge section 4 and the second hinge section 5 can make the first casing 2 and the second casing 3 be closed from the back-to-back state without any catching of an edge of the first casing one end face 2G on an edge of the holding section one end face 8AZ.

That is, if an operation is performed such that the first casing 2 and the second casing 3 are closed from the back-to-back state, the first hinge section 4 and the second hinge section 5 displace the holding section 8 along with the second display section 9 while changing positions in a reverse procedure to the above procedure and can finally return to the folded state.

1-3. Operation and Effects of Embodiment

In the above-described configuration, in the electronic apparatus 1, the first casing 2 and the second casing 3 are connected to each other through the first and second hinge sections 4 and 5 having the first turning shafts 16 and 26 provided at the first casing one end portion and the second turning shafts 17 and 27 provided at the second casing one end portion, so as to be able to be opened and closed.

Then, in the electronic apparatus 1, in the folded state and the back-to-back state of the first casing 2 and the second casing 3, the second display section 9 provided on the second casing one face 3A of the second casing 3 is displaced to the second casing other end side, and in the spread state of the first casing 2 and the second casing 3, the second display section 9 is displaced to the second casing one end side.

Therefore, in the electronic apparatus 1, in a case where the first display surface 6A in the first casing one face 2A and the second display surface 9A in the second casing one face 3A are visually observed in the spread state of the first casing 2 and the second casing 3, the amount of eye movement between the first display surface 6A and the second display surface 9A can be reduced.

Therefore, in the electronic apparatus 1, in a case where the first display surface 6A in the first casing one face 2A and the second display surface 9A in the second casing one face 3A are visually observed in the spread state of the first casing 2 and the second casing 3, eyestrain can be reduced.

According to the above-described configuration, the electronic apparatus 1 is made such that the first casing 2 and the second casing 3 are connected to each other through the first and second hinge sections 4 and 5 having the first turning shafts 16 and 26 provided at the first casing one end portion and the second turning shafts 17 and 27 provided at the second casing one end portion, so as to be able to be opened and closed in a range from the folded state to the back-to-back state, and such that in the folded state and the back-to-back state of the first casing 2 and the second casing 3, the second display section 9 provided on the second casing one face 3A is displaced to the second casing other end side and in the spread state of the first casing 2 and the second casing 3, the second display section 9 is displaced to the second casing one end side. Accordingly, in the electronic apparatus 1, in a case where the first display surface 6A in the first casing one face 2A and the second display surface 9A in the second casing one face 3A are visually observed in the spread state of the first casing 2 and the second casing 3, the amount of eye movement between the first display surface 6A and the second display surface 9A can be reduced, so that eyestrain can be reduced. Therefore, in the electronic apparatus 1, usability can be improved.

Further, in the electronic apparatus 1, the first hinge section 4 and the second hinge section 5 are provided close to the first and second casing left side faces 2C and 3C and the first and second casing right side faces 2D and 3D in the first casing one end portion of the first casing 2 and the second casing one end portion of the second casing 3. In addition, in the electronic apparatus 1, the second display section 9 is provided at the central portion of the second casing one face 3A of the second casing 3.

Accordingly, in the electronic apparatus 1, in the spread state of the first casing 2 and the second casing 3, it is possible to displace the second display section 9 to the second casing one end side without being interrupted by the first hinge section 4 and the second hinge section 5.

For this reason, in the electronic apparatus 1, in the spread state of the first casing 2 and the second casing 3, it is possible to bring the second display surface one end of the second display section 9 close to the first display surface one end of the first display section 6 provided on the first casing one face 2A.

Accordingly, in the electronic apparatus 1, in the spread state of the first casing 2 and the second casing 3, it is possible to drastically reduce the amount of eye movement between the first display surface 6A and the second display surface 9A, thereby significantly reducing eyestrain.

Further, in the electronic apparatus 1, the thicknesses of the first and second casings 2 and 3 and the thicknesses of the first and second hinge sections 4 and 5 are selected so as to be the same. Then, in the electronic apparatus 1, the first hinge section 4 and the second hinge section 5 are provided with respect to the first casing 2 and the second casing 3 such that the first hinge section 4 and the second hinge section 5 do not protrude from the first and second casing one faces 2A and 3A and the first and second casing other faces 2B and 3B in the spread state.

Accordingly, in the electronic apparatus 1, in a case where the first casing 2 and the second casing 3 are opened to be in the spread state, the first and second casings 2 and 3 as a whole can be made to be a single plate-like casing.

Then, in the electronic apparatus 1, at this time, the first display surface 6A and the second display surface 9A can be disposed and used at the central portion of one large display surface made of the first casing one face 2A and the second casing one face 3A in the first casing 2 and the second casing 3 as if they were one large display surface.

Further, in the electronic apparatus 1, in the first hinge section 4 and the second hinge section 5, the first turning shafts 16 and 26 and the second turning shafts 17 and 27 are made to be housed along with the first pulleys 18 and 28, the second pulleys 19 and 29, and the like in the first hinge case 15 and the second hinge case 25.

Accordingly, in the electronic apparatus 1, in the first hinge section 4 and the second hinge section 5, it is possible to protect the first turning shafts 16 and 26, the second turning shafts 17 and 27, the first pulleys 18 and 28, the second pulleys 19 and 29, and the like from dust or the like, thereby allowing them to function in an optimal state at all times.

Further, in the electronic apparatus 1, the second display section 9 provided on the second casing one face 3A of the second casing 3 is made so as to be biased to the second casing one end side by the spring. Further, in the electronic apparatus 1, the first cam portion 15G and the second cam portion 25G are made so as to be provided at the first hinge case 15 and the second hinge case 25 of the first hinge section 4 and the second hinge section 5.

Then, in the electronic apparatus 1, by changing the positions of the first hinge section 4 and the second hinge section 5 in accordance with opening and closing of the first casing 2 and the second casing 3, the second display section 9 is displaced to the second casing other end side and also to the second casing one end side by the first cam portion 15G and the second cam portion 25G.

Therefore, in the electronic apparatus 1, by a simple operation of only opening and closing of the first casing 2 and the second casing 3, it is possible to easily displace the second display section 9 to the second casing other end side in the folded state and the back-to-back state and to easily displace the second display section 9 to the second casing one end side in the spread state.

However, in the electronic apparatus 1, when starting to close the first casing 2 and the second casing 3 in order to fold them from the spread state, by making the holding section one end face 8AZ of the holding section 8 be placed on a corner portion between the first casing one face 2A and the first casing one end face 2G, the second display section 9 is displaced to the second casing other end side.

That is, in the electronic apparatus 1, when closing the first casing 2 and the second casing 3 from the spread state, the second display section 9 is displaced along with the holding section 8 to the second casing other end side by using the corner portion between the first casing one face 2A and the first casing one end face 2G without using the first cam portion 15G and the second cam portion 25G.

Further, in the electronic apparatus 1, when starting to further open the first casing 2 and the second casing 3 from the spread state in order to make them back-to-back, by making the holding section one end face 8AZ of the holding section 8 be placed on a corner portion between the first casing other face 2B and the first casing one end face 2G, the second display section 9 is displaced to the second casing other end side.

That is, in the electronic apparatus 1, when further opening the first casing 2 and the second casing 3 from the spread state, the second display section 9 is displaced along with the holding section 8 to the second casing other end side by using the corner portion between the first casing other face 2B and the first casing one end face 2G without using the first cam portion 15G and the second cam portion 25G.

Accordingly, in the electronic apparatus 1, even in a case where coefficients of friction between the planar first and second cam end faces 15GX and 25GX and the planar bottom faces of the left and right cutout portions 8AX and 8AY of the holding section 8 are large, it is possible to reliably displace the second display section 9.

That is, in the electronic apparatus 1, when starting to close or open the first casing 2 and the second casing 3 from the spread state, engagement of the first and second cam end faces 15GX and 25GX with the bottom faces of the left and right cutout portions 8AX and 8AY of the holding section 8 is avoided, so that it is possible to reliably displace the second display section 9 along with the holding section 8 to the second casing other end side.

Accordingly, in the electronic apparatus 1, it is possible to easily and reliably displace the second display section 9 to the second casing one end side and the second casing other end side in accordance with opening and closing of the first casing 2 and the second casing 3, Further, in the electronic apparatus 1, the wires 20 and 30 are respectively wound in a figure of eight on the first pulleys 18 and 28 and the second pulleys 19 and 29 fixed to one ends of the first turning shafts 16 and 26 and one ends of the second turning shafts 17 and 27 in the first hinge section 4 and the second hinge section 5.

Therefore, in the electronic apparatus 1, the first hinge section 4 and the second hinge section 5 can be reduced in size as much as possible. As a result, in the electronic apparatus 1, it is possible to freely open and close the first casing 2 and the second casing 3 between the folded state and the back-to-back state in a state where the first left shaft formation portion 2H and the second left shaft formation portion 3H are brought close to each other and the first right shaft formation portion 2J and the second right shaft formation portion 3J are also brought close to each other.

In this manner, in the folded state of the first casing 2 and the second casing 3, the electronic apparatus 1 is reduced in size as a whole, thereby being capable of being easily carried. Then, at this time, in the electronic apparatus 1, it is possible to hide and protect the first display surface 6A and the second display surface 9A from the outside and also prevent erroneous operations of the first touch panel 7 and the second touch panel 10.

Further, in the electronic apparatus 1, in the spread state of the first casing 2 and the second casing 3, the first display surface 6A and the second display surface 9A are flush with each other and brought close to each other, thereby being made as if they were one large display surface, and it is then possible to display one or a plurality of images thereon. Further, at this time, in the electronic apparatus 1, it is possible to perform a touch operation on a display surface made as if it were one large display surface.

Further, even in the back-to-back state of the first casing 2 and the second casing 3, the electronic apparatus 1 is reduced in size as a whole, thereby being capable of being easily carried. Then, in the electronic apparatus 1, at this time, for example, even during carrying, it is possible to expose the first display surface 6A and the second display surface 9A and then display various images and it is also possible to perform a touch operation on the first display surface 6A and the second display surface 9A.

In this way, in the electronic apparatus 1, it is possible to easily realize a state transition from the folded state to the back-to-back state of the first casing 2 and the second casing 3 and close arrangement of the first display surface 6A and the second display surface 9A in the spread state by a single operation of opening or closing the first casing 2 and the second casing 3.

2. Modified Examples 2-1. Modified Example 1

In addition, in the above-described embodiment, a description has been made with regard to a case where the first and second cam end faces 15GX and 25GX of the first and second hinge sections 4 and 5 and the bottom faces of the left and right cutout portions 8AX and 8AY of the holding section 8 have a planar form.

Figure 31A:
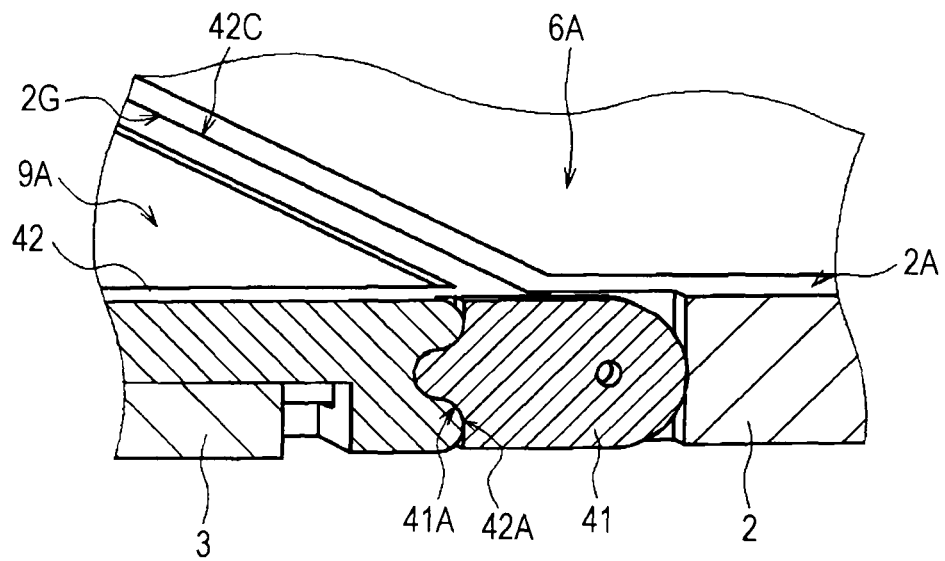
FIGS. 31A and 31B are diagrammatic perspective views illustrating the shapes of first and second cam end faces and the bottom faces of left and right cutout portions of a holding section according to another embodiment.
Figure 31B:
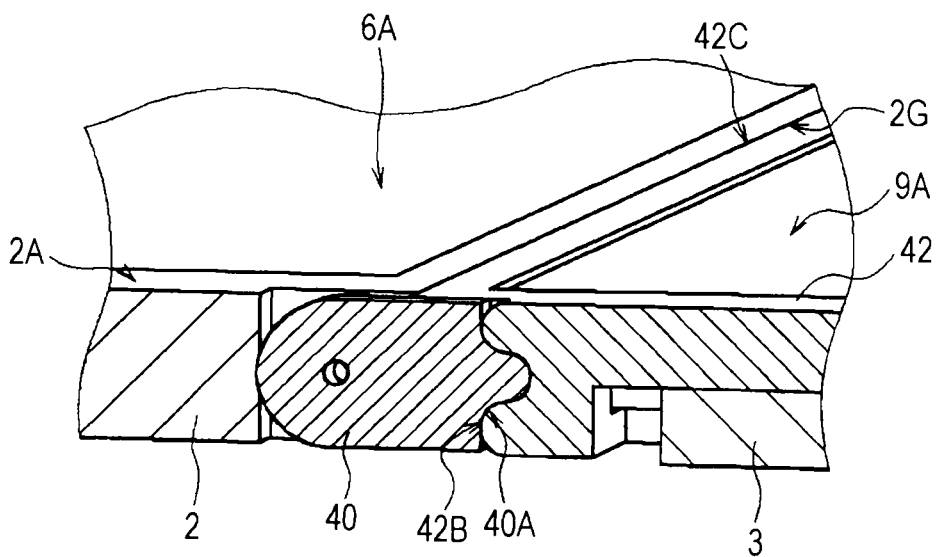

However, the present disclosure is not limited thereto and each of a first cam end face 40A of a first hinge section 40 and a second cam end face 41A of a second hinge section 41 may be formed into a convex shape, as shown in FIGS. 31A and 31B.

Further, in the present disclosure, each of the bottom faces of a left cutout portion 42A and a right cutout portion 42B of a holding section 42 may be formed into a concave shape being matched with the shape of each of the first cam end face 40A and the second cam end face 41A.

In the present disclosure, according to such a configuration, when starting to close the first casing 2 and the second casing 3 from the spread state, it is possible to make convex portions of the centers of the first cam end face 40A and the second cam end face 41A strike convex portions of the ends of the bottom faces of the left cutout portion 42A and the right cutout portion 42B of the holding section 42.

That is, in the present disclosure, when closing the first casing 2 and the second casing 3 from the spread state, it is possible to displace the second display section 9 along with the holding section 42 to the second casing other end side by using only the first cam end face 40A and the second cam end face 41A without making a holding section one end face 42C of the holding section 42 be placed on the corner portion between the first casing one face 2A and the first casing one end face 2G.

Further, in the present disclosure, also when starting to further open the first casing 2 and the second casing 3 from the spread state, it is possible to make the convex portions of the centers of the first cam end face 40A and the second cam end face 41A strike the convex portions of the ends of the bottom faces of the left cutout portion 42A and the right cutout portion 42B of the holding section 42.

That is, in the present disclosure, also when further opening the first casing 2 and the second casing 3 from the spread state, it is possible to displace the second display section 9 along with the holding section 42 to the second casing other end side by using only the first cam end face 40A and the second cam end face 41A without making the holding section one end face 42C of the holding section 42 be placed on the corner portion between the first casing one face 2A and the first casing one end face 2G.

In other words, in the present disclosure, by such a configuration, it is possible to easily and reliably displace the second display section 9 to the second casing one end side and the second casing other end side in accordance with opening and closing of the first casing 2 and the second casing 3 by using the first cam end face 40A and the second cam end face 41A without using the corner portion between the first casing other face 2B and the first casing one end face 2G.

2-2. Modified Example 2

Further, in the above-described embodiments, a description has been made with regard to a case where the first display section 6 is provided on the first casing one face 2A of the first casing 2. However, the present disclosure is not limited thereto and the first casing 2 may be made to function as a keyboard by arranging a plurality of operation keys on the first casing one face 2A of the first casing 2.

In the present disclosure, also by such a configuration, similarly to the cases of the above-described embodiments, in a case where the plurality of operation keys in the first casing one face 2A and the second display surface 9A in the second casing one face 3A are visually observed in the spread state of the first casing 2 and the second casing 3, the amount of eye movement can be reduced.

Therefore, in the present disclosure, also by such a configuration, eyestrain in a case where the plurality of operation keys in the first casing one face 2A and the second display surface 9A in the second casing one face 3A are visually observed in the spread state of the first casing 2 and the second casing 3 is reduced, whereby usability can be improved.

2-3. Modified Example 3

Further, in the above-described embodiment, a description has been made with regard to a case where the first casing 2 and the second casing 3 are connected to each other through the two first and second hinge sections 4 and 5 so as to be able to be opened and closed.

However, the present disclosure is not limited thereto and the first casing 2 and the second casing 3 may be connected to each other through a single hinge section so as to be able to be opened and closed. Then, in the present disclosure, in the case of such a configuration, for example the hinge section may be provided close to one side of the first and second casing left side faces 2C and 3C and the first and second right side faces 2D and 3D of the first and second casing one end portions.

2-4. Modified Example 4

Further, in the above-described embodiments, for disposition of the first hinge section 4 and the second hinge section 5, the first casing left cutout portion 2E is formed close to the first casing left side face 2C in the first casing one end portion and also the first casing right cutout portion 2F is formed close to the first casing right side face 2D.

Further, in the above-described embodiments, a description has been made with regard to a case where for disposition of the first hinge section 4 and the second hinge section 5, the second casing left cutout portion 3F is formed close to the second casing left side face 3C in the second casing one end portion and also the second casing right cutout portion 3G is formed close to the second casing right side face 3D.

However, the present disclosure is not limited thereto and for disposition of the first hinge section 4 and the second hinge section 5, in the first casing, the left cutout portion is formed in the first casing one end portion of the first casing left side face and also the right cutout portion is formed in the first casing one end portion of the first casing right side face.

Further, in the present disclosure, for disposition of the first hinge section 4 and the second hinge section 5, in the second casing, the left cutout portion is formed in the second casing one end portion of the second casing left side face and also the right cutout portion is formed in the second casing one end portion of the second casing right side face.

Then, in the present disclosure, in the first casing, the first turning shaft is provided in parallel with the first casing width direction at an inner wall of the left cutout portion of the first casing left side face and also the second turning shaft is provided in parallel with the first casing width direction at an inner wall of the right cutout portion of the first casing right side face.

Further, in the present disclosure, in the second casing, the first turning shaft is provided in parallel with the second casing width direction at an inner wall of the left cutout portion of the second casing left side face and also the second turning shaft is provided in parallel with the second casing width direction at an inner wall of the right cutout portion of the second casing right side face.

Accordingly, in the present disclosure, the first hinge section having the first turning shaft and the second turning shaft is disposed over the left cutout portion of the first casing left side face and the left cutout portion of the second casing left side face.

Further, in the present disclosure, the second hinge section having the first turning shaft and the second turning shaft is disposed over the right cutout portion of the first casing right side face and the right cutout portion of the second casing right side face. In this way, in the present disclosure, the first casing and the second casing may be connected to each other through the first hinge section and the second hinge section so as to be able to be opened and closed.

In the present disclosure, in the case of such a configuration, a first cam portion and a second cam portion can also be provided at the first hinge section and the second hinge section, similarly to the above description. Then, in the present disclosure, in the case of such a configuration, by narrowing the widths of the first casing and the second casing or widening the width of the holding section compared to the above-described embodiments, it is possible to displace the second display section along with the holding section by using the first cam portion and the second cam portion.

2-5. Modified Example 5

Further, in the above-described embodiments, a description has been made with regard to a case where the electronic apparatus according to the present disclosure is applied to the electronic apparatus 1 described above with reference to FIGS. 1 to 31B.

However, the present disclosure is not limited thereto and the electronic apparatus can be applied to a folding-type PDA (Personal Digital Assistance), a folding-type personal computer (that is, a notebook computer), a folding-type mobile telephone, or a folding-type portable game machine.

That is, the present disclosure can be widely applied to folding-type electronic apparatuses having various other configurations, like an electronic apparatus which is formed by pivotally connecting a first casing provided with a display section or an operation section and a second casing provided with a display section through a hinge section.

2-6. Modified Example 6

Further, in the above-described embodiments, a description has been made with regard to a case where as a first casing, the first casing 2 of an approximately flat rectangular shape described above with reference to FIGS. 1 to 31B is applied.

However, the present disclosure is not limited thereto and it is possible to widely apply first casings having various other configurations, like a first casing in which each of one face and the other face is formed into a racetrack shape, an elliptical shape, or a trapezoidal shape, a first casing having a different thickness from that of a second casing, or the like.

2-7. Modified Example 7

Further, in the above-described embodiments, a description has been made with regard to a case where as a second casing, the second casing 3 of an approximately flat rectangular shape described above with reference to FIGS. 1 to 31B is applied.

However, the present disclosure is not limited thereto and it is possible to widely apply second casings having various other configurations, like a second casing in which each of one face and the other face is formed into a racetrack shape, an elliptical shape, or a trapezoidal shape, a second casing having a different thickness from that of a first casing, or the like.

2-8. Modified Example 8

Further, in the above-described embodiments, a description has been made with regard to a case where as hinge sections, each of which has a first turning shaft provided at the first casing one end portion of the first casing and a second turning shaft provided at the second casing one end portion of the second casing and connects the first casing and the second casing so as to be able to be opened and closed in a range from the folded state to the back-to-back state through the first turning shaft and the second turning shaft, the first hinge section 4 and the second hinge section 5 described above with reference to FIGS. 1 to 31B are applied.

However, the present disclosure is not limited thereto and a hinge section provided only at the side face side of one of the first casing 2 and the second casing 3 or hinge sections which have no hinge case and expose the first turning shafts 16 and 26 and the second turning shafts 17 and 27 along with the first pulleys 18 and 28 and the second pulleys 19 and 29 may be applied.

Further, in the present disclosure, it is possible to widely apply hinge sections having various other configurations, like a hinge section which has at least two gears respectively fixed to one end of a first turning shaft and one end of a second turning shaft and turns the first and second turning shafts in the opposite directions by making at least two gears be directly engaged with each other or be engaged with each other through an even number of gears, or the like.

2-9. Modified Example 9

Further, in the above-described embodiments, a description has been made with regard to a case where as a display section provided on the second casing one face of the second casing, the second display 9 described above with reference to FIGS. 1 to 31B is applied.

However, the present disclosure is not limited thereto and it is possible to widely apply display sections having various other configurations, like a display panel integrated with a touch panel, a sheet-like display section, or the like.

2-10. Modified Example 10

Further, in the above-described embodiments, a description has been made with regard to a case where as a displacement section which displaces the display section to the second casing other end side of the second casing in the folded state and the back-to-back state of the first casing and the second casing and displaces the display section to the second casing one end side in the spread state of the first casing and the second casing, the first and second cam portions 15G and 25G provided at the first and second hinge cases 15 and 25 of the first and second hinge sections 4 and 5 described above with reference to FIGS. 1 to 31B are applied.

However, the present disclosure is not limited thereto and it is possible to apply displacement sections having various other configurations, like a displacement section which is constituted by a spring biasing the second display section 9 provided at the second casing 2 to the second casing one end side and a wire connecting one side of the first pulleys 18 and 28 and the second pulleys 19 and 29 to an end portion on the second casing other end side in the second display section 9, or the like.

Incidentally, in the present disclosure, in a case where the displacement section is constituted by the spring and the wire, in the spread state of the first casing 2 and the second casing 3, the second display section 9 is biased and displaced to the second casing one end side by the spring by bending the wire.

Further, in the present disclosure, in a case where the displacement section is constituted by the spring and the wire, in the folded state and the back-to-back state of the first casing 2 and the second casing 3, the second display section 9 is displaced to the second casing other end side by winding the wire by a given amount by one side of the first pulleys 18 and 28 and the second pulleys 19 and 29.

That is, in the present disclosure, in this manner, even in a case where the displacement section is constituted by the spring and the wire, similarly to the above-described embodiments, it is possible to displace the second display section 9 in accordance with opening and closing of the first casing 2 and the second casing 3.

2-11. Modified Example 11

Further, in the above-described embodiments, a description has been made with regard to a case where as a hinge case having a thickness equal to the thicknesses of the first and second casings and housing the first and second turning shafts, the first and second hinge cases 15 and 25 described above with reference to FIGS. 1 to 31B are applied.

However, the present disclosure is not limited thereto and it is possible to widely apply hinge cases having various other configurations, like a hinge case formed exclusively of a cam portion, or the like.

2-12. Modified Example 12

Further, in the above-described embodiments, a description has been made with regard to a case where as a display section provided at the central portion of the first casing one face of the first casing, the first display section 6 described above with respect to FIGS. 1 to 31B is applied.

However, the present disclosure is not limited thereto and it is possible to widely apply display sections having various other configurations, like a display panel integrated with a touch panel, a sheet-like display section, or the like.

The present disclosure contains subject matter related to that disclosed in Japanese Priority Patent Application JP 2010-199346 filed in the Japan Patent Office on Sep. 6, 2010, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. An electronic apparatus comprising:
 a first casing;
 a second casing;
 a hinge section comprising a first turning shaft provided at one end of the first casing and a second turning shaft provided at one end of the second casing,
 wherein the hinge section connects the first casing and the second casing, wherein the first casing and the second casing are capable of being opened or closed in a range from a folded state to a back-to-back state through the first turning shaft and the second turning shaft; and
 a display section provided on one face of the second casing; and
 a displacement section operable to:
  displace the display section on the second casing along a plane in a first direction when the first casing and the second casing are in the folded state or the back-to-back state, and
  displaces the display section along the plane in a second direction opposite to the first direction when the first casing and the second casing are in a spread state.

2. The electronic apparatus according to claim 1, wherein the hinge section comprises the first turning shaft provided close to a first casing side face, and the second turning shaft provided close to a second casing side face, and wherein the display section is provided at a central portion of the one face of the second casing.

3. The electronic apparatus according to claim 2, wherein the first casing and the second casing have the same thickness, and
 the hinge section has the same thickness as the thicknesses of the first casing and the second casing, wherein the hinge section changes a position in accordance with opening and closing of the first casing and the second casing, and is provided so as not to protrude from a first face and a second face of the first casing and a first face and a second face of the second casing in the spread state of the first casing and the second casing.

4. The electronic apparatus according to claim 3, wherein the hinge section comprises a hinge case which has the same thickness as the thicknesses of the first casing and the second casing and houses the first turning shaft and the second turning shaft.

5. The electronic apparatus according to claim 4, further comprising a spring operable to biases the display section in the second direction, and
 wherein the displacement section comprises a cam portion at the hinge case of the hinge section so as to displace the display section biased in the second direction by the spring, in accordance with opening and closing of the first casing and the second casing.

6. The electronic apparatus according to claim 5, wherein the hinge section comprises a first pulley housed in the hinge case and fixed to the first turning shaft, a second pulley housed in the hinge case and fixed to the second turning shaft, and a wire housed in the hinge case and wound in a figure of eight from a side face of the first pulley to a side face of the second pulley.

7. The electronic apparatus according to claim 1, further comprising a display section provided at a central portion of the one face of the first casing.

8. The electronic apparatus according to claim 1, wherein the angle between the display section of the first casing and the display section of the second casing is about zero degrees in the folded state,
 wherein the angle between the display section of the first casing and the display section of the second casing is about 360 degrees in the back-to-back state, and
 wherein the angle between the display section of the first casing and the display section of the second casing is about 180 degrees in the spread state.

9. The electronic apparatus according to claim 1, wherein a transparent touch panel covers the display section on the second casing.

10. The electronic apparatus according to claim 1, further comprising a display section disposed on the first casing.

11. The electronic apparatus according to claim 1, wherein the display section on the first casing is covered by a transparent touch panel.

* * * * *